(12) United States Patent
Takakuwa

(10) Patent No.: US 9,966,316 B2
(45) Date of Patent: May 8, 2018

(54) DEPOSITION SUPPORTING SYSTEM, DEPOSITING APPARATUS AND MANUFACTURING METHOD OF A SEMICONDUCTOR DEVICE

(71) Applicant: Toshiba Memory Corporation, Minato-ku (JP)

(72) Inventor: Manabu Takakuwa, Tsu (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 83 days.

(21) Appl. No.: 15/252,604

(22) Filed: Aug. 31, 2016

(65) Prior Publication Data

US 2017/0345727 A1 Nov. 30, 2017

Related U.S. Application Data

(60) Provisional application No. 62/341,139, filed on May 25, 2016.

(51) Int. Cl.
| | |
|---|---|
| *G06F 7/00* | (2006.01) |
| *B65B 35/50* | (2006.01) |
| *H01L 21/66* | (2006.01) |
| *H01L 21/67* | (2006.01) |
| *H01L 25/065* | (2006.01) |
| *H01L 25/00* | (2006.01) |
| *H01L 27/1157* | (2017.01) |
| *H01L 27/11578* | (2017.01) |

(52) U.S. Cl.
CPC ........ *H01L 22/20* (2013.01); *H01L 21/67259* (2013.01); *H01L 25/0657* (2013.01); *H01L 25/50* (2013.01); *H01L 27/1157* (2013.01); *H01L 27/11578* (2013.01)

(58) Field of Classification Search
None
See application file for complete search history.

(56) References Cited

U.S. PATENT DOCUMENTS

| | | | |
|---|---|---|---|
| 6,625,497 B2 | 9/2003 | Fairbairn et al. | |
| 2007/0292632 A1* | 12/2007 | Yoshida | B65G 49/061 428/1.1 |
| 2008/0101912 A1* | 5/2008 | Martin | H01L 21/6719 700/254 |

FOREIGN PATENT DOCUMENTS

| | | |
|---|---|---|
| JP | 2005-521235 | 7/2005 |
| JP | 2009-200391 | 9/2009 |
| JP | 2012-165214 | 8/2012 |
| JP | 2015-43452 | 3/2015 |
| JP | 2015-130539 | 7/2015 |

(Continued)

*Primary Examiner* — Yolanda R Cumbess
(74) *Attorney, Agent, or Firm* — Oblon, McClelland, Maier & Neustadt, L.L.P.

(57) ABSTRACT

According to one embodiment, deposition supporting system, depositing apparatus and manufacturing method of a semiconductor device includes a depositing apparatus that deposits stacked bodies on wafers allocated to stations and a host computer. The host computer evaluates feature amounts convertible to misalignments at predetermined points on the stacked bodies of the respective wafers, and specifies the stations to which the wafers are to be allocated based on the feature amounts of the stacked bodies in the respective stations. The depositing apparatus allocates the wafers to the stations based on the specification from the host computer.

20 Claims, 14 Drawing Sheets

(56) References Cited

FOREIGN PATENT DOCUMENTS

JP         2015-220458     12/2015
WO    WO 03/007365 A2    1/2003

\* cited by examiner

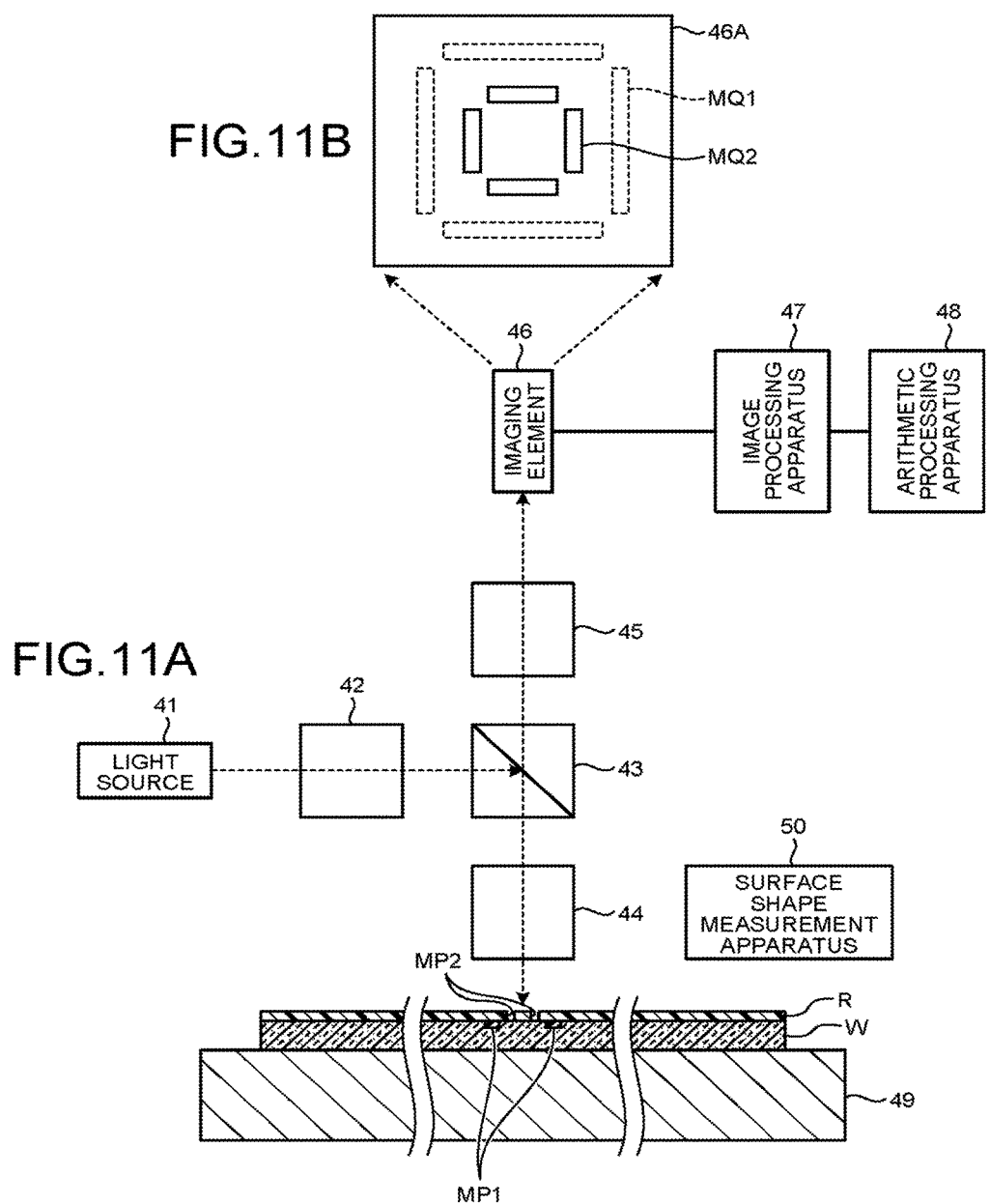

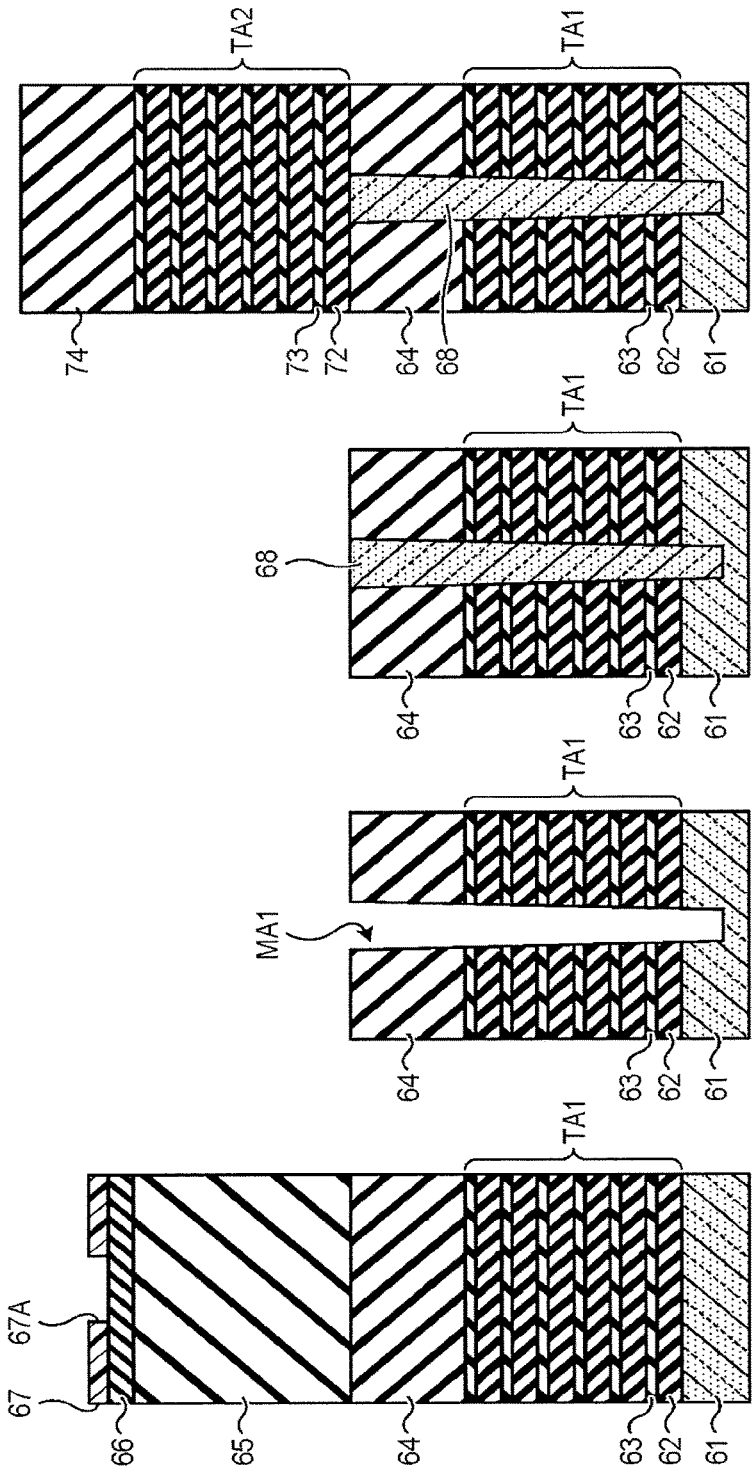

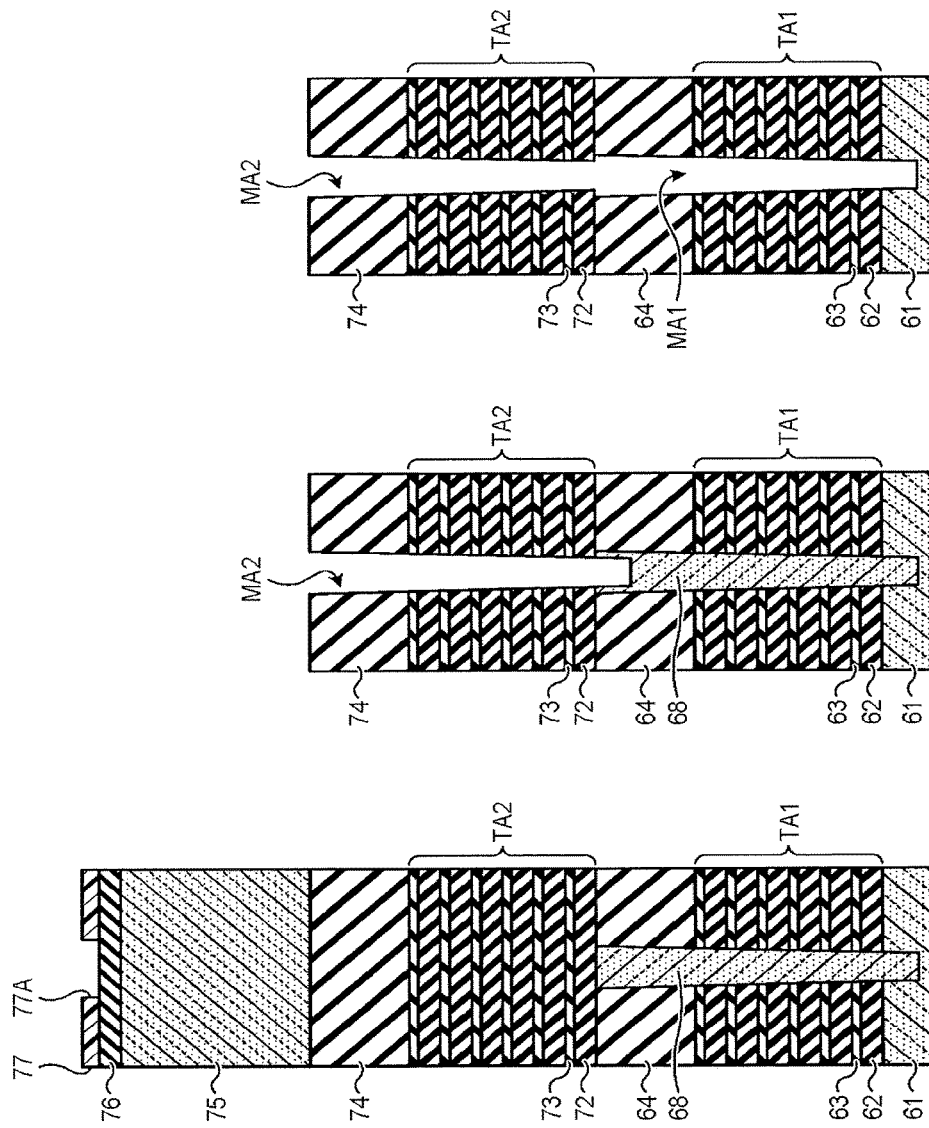

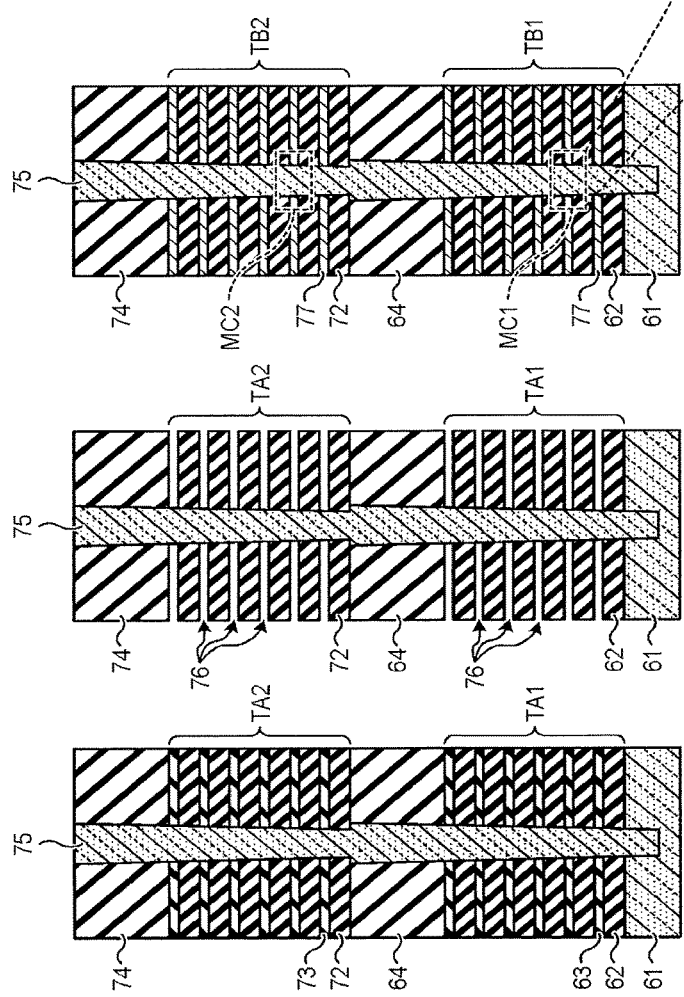

DEPOSITION SUPPORTING SYSTEM, DEPOSITING APPARATUS AND MANUFACTURING METHOD OF A SEMICONDUCTOR DEVICE

CROSS-REFERENCE TO RELATED APPLICATIONS

This application is based upon and claims the benefit of priority from U.S. Provisional Application No. 62/341,139, filed on May 25, 2016; the entire contents of which are incorporated herein by reference.

FIELD

Embodiments described herein relate generally to a deposition supporting system, a depositing apparatus, and a manufacturing method of a semiconductor device.

BACKGROUND

To achieve high integration of a non-volatile semiconductor storage device, memory cells may be arranged three-dimensionally. In this case, there is demand for increasing the aspect ratio of a hole pattern to increase the efficiency of a memory cell stacking process.

BRIEF DESCRIPTION OF THE DRAWINGS

FIG. 11A is a schematic cross-sectional view of a configuration of misalignment inspection apparatus for use in the deposition supporting system according to the second embodiment, and FIG. 11B is a plane view of an example of misalignment inspection marks detected by an imaging element illustrated in FIG. 11A;

FIGS. 12A to 12D are cross-sectional views illustrating a manufacturing method of a semiconductor device according to a third embodiment;

FIGS. 13A to 13C are cross-sectional views illustrating the manufacturing method of the semiconductor device according to the third embodiment;

FIGS. 14A to 14C are cross-sectional views illustrating the manufacturing method of the semiconductor device according to the third embodiment, and FIG. 14D is a cross-sectional view of a configuration example of a memory cell illustrated in FIG. 14C.

DETAILED DESCRIPTION

In general, according to one embodiment, a depositing apparatus deposits stacked bodies on wafers allocated to respective stations, and a host computer is connected to the depositing apparatus. The host computer includes an evaluation unit that evaluates feature amounts convertible to misalignments at predetermined points on the stacked bodies of the respective stations, and a specification unit that specifies the stations to which the wafers are to be allocated based on the feature amounts of the stacked bodies in the respective stations. The depositing apparatus includes an allocation unit that allocates the wafers to the stations based on the specification from the host computer.

Exemplary embodiments of a deposition supporting system, a depositing apparatus, and a manufacturing method of a semiconductor device will be explained below in detail with reference to the accompanying drawings. The present invention is not limited to the following embodiments.

First Embodiment

Figure 1:
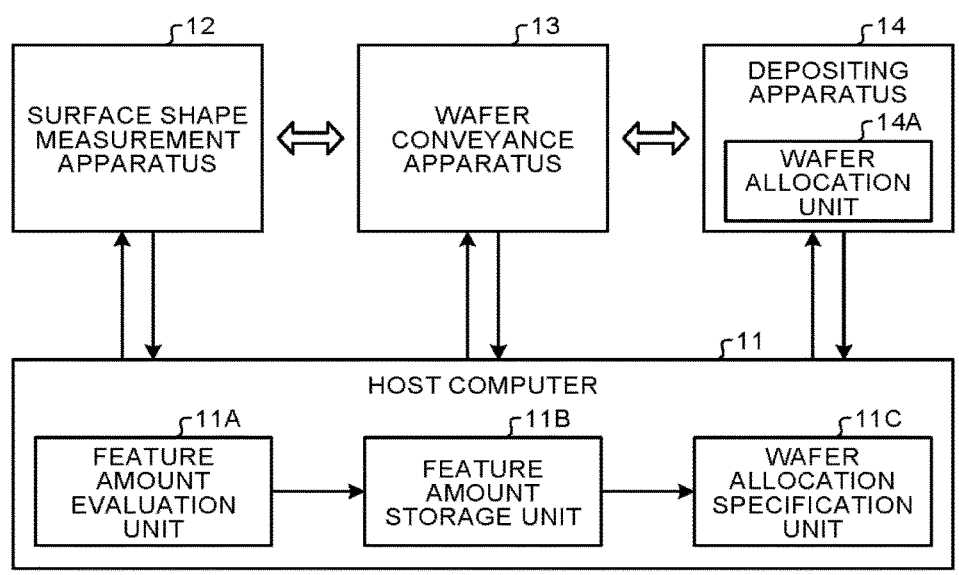
FIG. 1 is a schematic block diagram of a deposition supporting system according to a first embodiment.

FIG. 1 is a schematic block diagram of a deposition supporting system according to a first embodiment.

Referring to FIG. 1, the deposition supporting system includes a host computer 11, a surface shape measurement apparatus 12, a wafer conveyance apparatus 13, and a depositing apparatus 14. Instead of the surface shape measurement apparatus 12, a stress measurement apparatus may be provided. The surface shape measurement apparatus 12, the wafer conveyance apparatus 13, and the depositing apparatus 14 can perform data communications with the host computer 11. The surface shape measurement apparatus 12 and the depositing apparatus 14 can exchange wafers via the wafer conveyance apparatus 13. The host computer 11 includes a feature amount evaluation unit 11A, a feature amount storage unit 11B, and a wafer allocation specification unit 11C. The depositing apparatus 14 includes a wafer allocation unit 14A.

The surface shape measurement apparatus 12 can measure the surface shape of a wafer on which a stacked body is formed. The surface shape of the wafer may be height distribution on the wafer surface. Alternatively, the surface shape of the wafer may be nano-topography of the wafer surface. The nano-topography represents asperities on the surface of the wafer with spatial frequency components within a specific range. The nano-topography can represent height differences in a region of a specified size. The surface shape can be measured by shearing interferometry, Fizeau interferometry, Mach-Zehnder interferometry, atomic force surface shape measuring method, or a combination of the foregoing measurement methods.

The material for the wafer can be a semiconductor such as Si. An insulation film, a metallic film, or a semiconductor film may be formed on the wafer. The insulation film may be formed from $SiO_2$, SiN, or the like, for example. The metallic film may be formed from Al, Cu, or W, for example. The semiconductor film may be formed from polycrystalline silicon or amorphous silicon. A device pattern may be formed on the wafer. The device pattern may be a wiring pattern, an electrode pattern, a hole pattern, a trench pattern, or a slit pattern, for example.

The stacked body may have layers different in etching rate alternately stacked. The stacked body may have insulation layers of different materials alternately stacked, or semiconductor layers different in impurity content alternately stacked. For example, in the stacked body, silicon oxide films and silicon nitride films may be stacked alternatively, or impurity-doped silicon films and impurity-undoped silicon films may be alternatively stacked.

The depositing apparatus 14 can deposit the stacked body on the wafer. At that time, the depositing apparatus 14 can accumulate the stacked body on the wafer at N (N is an integer of 2 or more) stages. For example, in the case of accumulating the stacked body at two stages, the depositing apparatus 14 can deposit a first stacked body on the wafer and deposit a second stacked body on the first stacked body. The depositing apparatus 14 can include M (M is a positive integer) chambers each housing K (K is an integer of 2 or more) wafers. The chambers can each include K stations corresponding to the K wafers. The chambers can subject the K wafers to batch processing at the deposition of the stacked body.

The stations can hold one each wafer at the deposition of the stacked body. The wafer allocation unit 14A can allocate the wafers to the stations. At that time, the wafer allocation unit 14A can set the allocation of the wafers based on feature amounts convertible to misalignments at predetermined points on the stacked bodies. The feature amounts may be convertible to nano-topography or stress as well as misalignments. The feature amounts may take values obtained by subtracting components corrected by the exposure apparatus. The wafer allocation unit 14A may allocate the wafers to the stations based on a specification from the host computer 11.

The host computer 11 can control comprehensively the surface shape measurement apparatus 12, the wafer conveyance apparatus 13, and the depositing apparatus 14 in the depositing process by the depositing apparatus 14. The feature amount evaluation unit 11A can evaluate the feature amounts convertible to misalignments at predetermined points on the stacked bodies on the respective wafers. The feature amount storage unit 11B can store correspondence relationship between the feature amounts at the deposition of the first stacked bodies and the feature amounts at the deposition of the second stacked bodies in the respective stations. The wafer allocation specification unit 11C can specify the stations to which the wafers are to be allocated based on the feature amounts of the wafers in the respective stations.

In the past lot, the wafers are conveyed to the surface shape measurement apparatus 12 before the deposition of the first stacked bodies. Then, the surface shape measurement apparatus 12 measures the surface shapes of the wafers before the deposition of the first stacked bodies, and sends the measurement values to the feature amount evaluation unit 11A. When the surface shapes of the wafers before the deposition of the first stacked bodies are measured, the wafers are conveyed to the depositing apparatus 14. The depositing apparatus 14 deposits the first stacked bodies on the wafers.

After the deposition of the first stacked bodies, the wafers are conveyed to the surface shape measurement apparatus 12. The surface shape measurement apparatus 12 measures the surface shapes of the wafers after the deposition of the first stacked bodies, and sends the measurement values to the feature amount evaluation unit 11A. The feature amount evaluation unit 11A calculates the feature amounts of the first stacked bodies based on the measurement values of the surface shapes before and after the deposition of the first stacked bodies, and stores the calculated feature amounts in the feature amount storage unit 11B.

In the past lot, when the surface shapes of the wafers after the deposition of the first stacked bodies are measured, the wafers are conveyed to the depositing apparatus 14. The depositing apparatus 14 deposits the second stacked bodies on the first stacked bodies. After the deposition of the second stacked bodies, the wafers are conveyed to the surface shape measurement apparatus 12. The surface shape measurement apparatus 12 measures the surface shapes of the wafers after the deposition of the second stacked bodies, and sends the measurement values to the feature amount evaluation unit 11A. The feature amount evaluation unit 11A calculates the feature amounts of the second stacked bodies based on the measurement values of the surface shapes before and after the deposition of the second stacked bodies, and stores the calculated feature amounts in the feature amount storage unit 11B. At that time, the feature amount storage unit 11B can hold correspondence relationship between the feature amounts of the first stacked bodies and the feature amounts of the second stacked bodies.

Next, in the present lot, the wafers are conveyed to the surface shape measurement apparatus 12 before the deposition of the first stacked bodies. Then, the surface shape measurement apparatus 12 measures the surface shapes of the wafers before the deposition of the first stacked bodies, and sends the measurement values to the feature amount evaluation unit 11A. When the surface shapes of the wafers before the depositions of the first stacked bodies are measured, the wafers are conveyed to the depositing apparatus 14. The depositing apparatus 14 deposits the first stacked bodies on the wafers.

After the deposition of the first stacked bodies, the wafers are conveyed to the surface shape measurement apparatus 12. The surface shape measurement apparatus 12 measures the surface shapes of the wafers after the deposition of the first stacked bodies, and sends the measurement values to the feature amount evaluation unit 11A. The feature amount evaluation unit 11A calculates the feature amounts of the first stacked bodies based on the measurement values of the surface shapes before and after the deposition of the first stacked bodies, and stores the calculated amounts in the feature amount storage unit 11B.

Then, based on the correspondence relationship in the past lot stored in the feature amount storage unit 11B, stations in which the feature amounts at the deposition of the second stacked bodies satisfy an evaluation formula relative to the feature amounts at the deposition of the first stacked bodies in the present lot are selected. The evaluation formula can be set such that the differences between the feature amounts at the deposition of the first stacked bodies and the feature amounts at the deposition of the second stacked bodies fall within a permissible value. The evaluation formula may be set such that the total sum of the feature amounts at the deposition of the first stacked bodies and the feature amounts at the deposition of the second stacked bodies falls within a permissible value. These feature amounts may be weighted.

The evaluation formula can be given by the following equation (1), for example. In the equation, $\Sigma$ represents the total sum of feature amounts at respective measurement points set in the wafer plane.

$$Th \geq \Sigma(\beta \times Sp_2 - \alpha \times Sp_1) \quad (1)$$

where

Th represents a permissible value;

$Sp_1$ represents feature amounts at the deposition of the first stacked bodies;

$Sp_2$ represents feature amounts at the deposition of the second stacked bodies;

$\alpha$ represents a weight to the feature amounts at the deposition of the first stacked bodies; and $\beta$ represents a weight to the feature amounts at the deposition of the second stacked bodies.

The weights $\alpha$ and $\beta$ can be set depending on the number of layers in the stacked bodies, the film thicknesses of the layers in the stacked bodies, the materials for the layers in the stacked bodies, the film qualities of the layers in the stacked bodies, and others. The feature amounts $Sp_1$ and $Sp_2$ can be the values in the past lot.

The evaluation formula may be given by the following equation (2):

$$Th \geq \Sigma(\beta \times Sp_2 + \alpha Sp_1) \quad (2)$$

When third stacked bodies are further stacked on the second stacked bodies, the evaluation formula can be given by the following equation (3), for example:

$$Th \geq \Sigma(\gamma \times Sp_3 - (\beta \times Sp_2 + \alpha \times Sp_1)) \quad (3)$$

where $Sp_3$ represents feature amounts at the deposition of the third stacked bodies; and $\gamma$ represents a weight to the feature amounts at the deposition of the third stacked bodies.

The weight $\gamma$ can be set depending on the number of layers in the third stacked bodies, the film thicknesses of the layers in the third stacked bodies, the materials for the layers in the third stacked bodies, the film qualities of the layers in the third stacked bodies, and others.

When the third stacked bodies are further stacked on the second stacked bodies, the evaluation formula can be given by the following equation (4):

$$Th \geq \Sigma(\gamma \times Sp_3 + \beta \times Sp_2 + \alpha \times Sp_1) \quad (4)$$

Then, the wafer allocation specification unit 11C instructs the depositing apparatus 14 to allocate the wafers to the stations in the selected chambers. The wafer allocation unit 14A allocates the wafers to the stations in the chambers according to the specification from the host computer 11. Then, in the stations in the chambers of the depositing apparatus 14, the second stacked bodies are deposited on the first stacked bodies in the present lot.

Accordingly, for one wafer, different stations can be selected for the deposition of the first stacked body and the deposition of the second stacked body such that the feature amounts at the deposition of the second stacked body are close to the feature amounts at the deposition of the first stacked body. Accordingly, even when the feature amounts vary between the deposition of the first stacked body and the deposition of the second stacked body in one station, it is possible to reduce the variations in the feature amounts between the deposition of the first stacked body and the deposition of the second stacked body on one wafer. As a result, it is possible to reduce misalignments between the first stacked bodies and the second stacked bodies on the respective wafers, and improve the accuracy of alignment between the first stacked bodies and the second stacked bodies.

When K wafers are subjected to batch processing in the respective chambers, the stations in which second feature amounts at the deposition of the second stacked bodies satisfy the evaluation formula relative to the feature amounts at the deposition of the first stacked bodies can be selected for all the K wafers. Then, the wafers can be allocated to the selected stations. Alternatively, when M×K wafers are subjected to batch processing in each depositing apparatus 14, the stations in the chambers in which the second feature amounts at the deposition of the second stacked bodies satisfy the evaluation formula relative to the feature amounts at the deposition of the first stacked bodies can be selected for all the M×K wafers. Then, the wafers can be allocated to the stations in the selected chambers.

Accordingly, even though the feature amounts vary between the deposition of the first stacked bodies and the deposition of the second stacked bodies in the respective M×K stations, it is possible to reduce the variations between the deposition of the first stacked bodies and the deposition of the second stacked bodies in the respective M×K stations. As a result, even when the M×K wafers are subjected to batch processing, it is possible to reduce misalignments between the first stacked bodies and the second stacked bodies in the respective M×K wafers, and improve the accuracy of alignment between the first stacked bodies and the second stacked bodies in the respective wafers while decreasing the amount of time to wait until completion of the depositing process.

Figure 2:
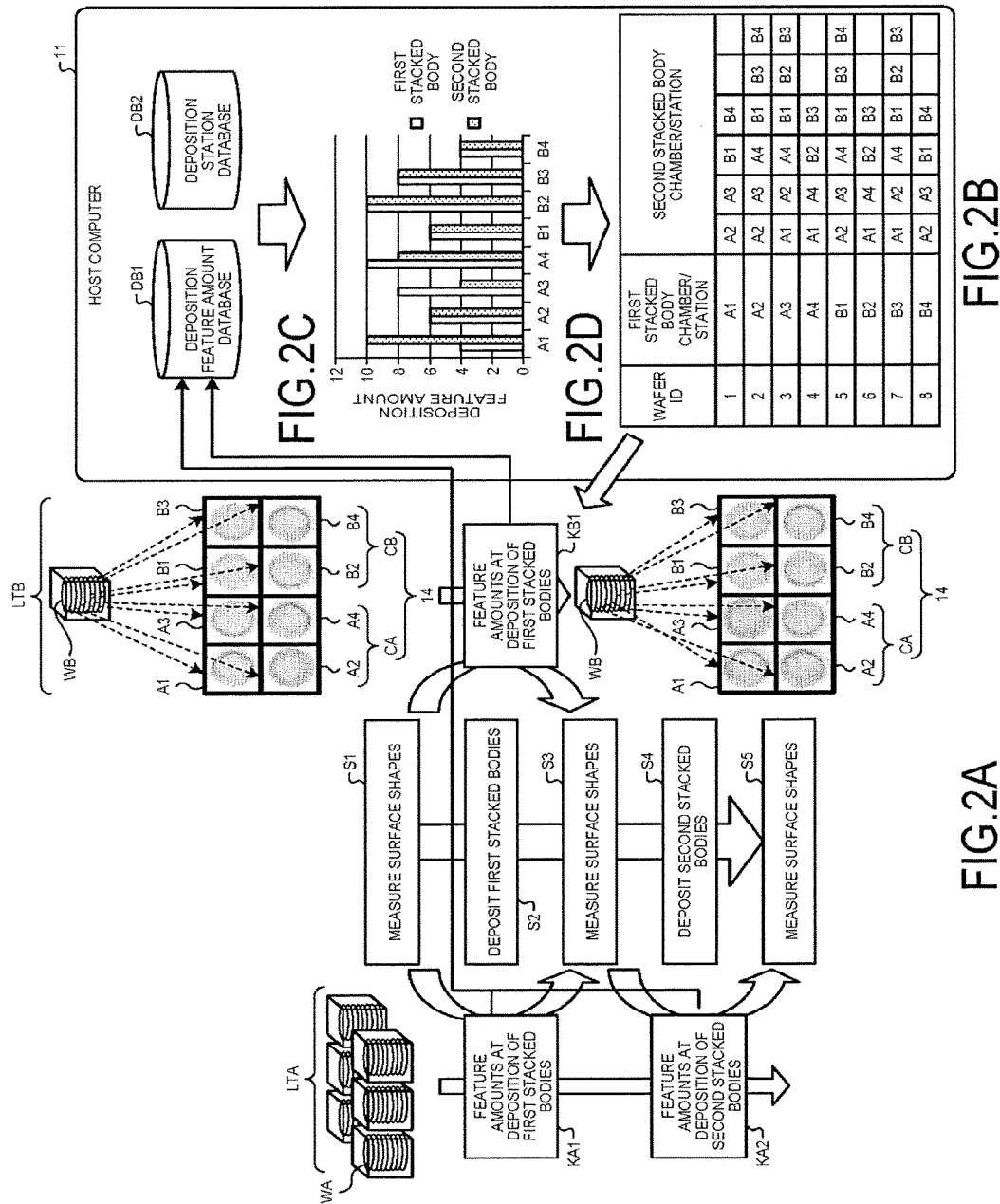
FIG. 2A is a diagram illustrating a depositing method to which the deposition supporting system according to the first embodiment is applied.
FIG. 2B is a diagram illustrating an example of process by a host computer applied to the deposition supporting system according to the first embodiment.
FIG. 2C is a diagram of an example of correspondence relationships between feature amounts at the deposition of first stacked bodies and feature amounts at the deposition of second stacked bodies applied to the deposition supporting system according to the first embodiment.
FIG. 2D is a diagram illustrating an example of stations in chambers to which wafers with the first stacked bodies can be allocated at the deposition of the second stacked bodies.

FIG. 2A is a diagram illustrating a depositing method to which the deposition supporting system according to the first embodiment is applied, FIG. 2B is a diagram illustrating an example of process by the host computer applied to the deposition supporting system according to the first embodiment, FIG. 2C is a diagram of an example of correspondence relationships between feature amounts at the deposition of the first stacked bodies and feature amounts at the deposition of the second stacked bodies applied to the deposition supporting system according to the first embodiment, and FIG. 2D is a diagram illustrating an example of stations in chambers to which wafers with the first stacked bodies can be allocated at the deposition of the second stacked bodies.

FIGS. 2A to 2D illustrate the example in which the depositing apparatus 14 has two chambers CA and CB, the chamber CA has four stations A1 to A4, and the chamber CB has four stations B1 to B4, for example. In addition, FIGS. 2A to 2D illustrate the example in which stacked bodies are stacked in two stages. In this case, the first stacked bodies are deposited on the wafers, and the second stacked bodies are deposited on the first stacked bodies.

Referring to FIG. 2A, the depositing apparatus 14 has the chambers CA and CB, the chamber CA has the stations A1 to A4, and the chamber CB has the stations B1 to B4. The chambers CA and CB can both subject a plurality of wafers to batch processing at deposition of stacked bodies. The stations A1 to A4 and B1 to B4 can hold one each wafer. In this case, the chamber CA can subject collectively the four wafers held in the stations A1 to A4 to depositing process. The chamber CB can subject collectively the four wafers held in the stations B1 to B4 to depositing process.

The host computer 11 has a deposition feature amount database DB1 and a deposition station database DB2. The deposition feature amount database DB1 can store the correspondence relationship between the feature amounts at the deposition of the first stacked bodies and the feature amounts at the deposition of the second stacked bodies in the respective stations A1 to A4 and B1 to B4 of the chambers CA and CB. The deposition station database DB2 can store information for specifying in which of the stations A1 to A4 and B1 to B4 of which of the chambers CA and CB the first stacked bodies and the second stacked bodies have been deposited on the respective wafers. The deposition feature amount database DB1 and the deposition station database DB2 can be used as feature amount storage unit 11B illustrated in FIG. 1.

The depositing process according to the first embodiment will be explained below. In the following explanation, eight wafers are allocated to the stations A1 to A4 and B1 to B4, and the eight wafers are collectively subjected to depositing process as an example.

In a past lot LTA, wafers WA are subjected to depositing process. The lot here refers to an aggregate of products conveyed collectively between processing steps. The lot may be an aggregate of products that can be regarded as being equal in quality. In this case, the quality of the products can be managed by lot.

The surface shape measurement apparatus 12 measures the surface shapes of the wafers WA before the deposition of the first stacked bodies (S1). Next, the depositing apparatus 14 deposits the first stacked bodies on the wafers WA (S2). At that time, eight wafers WA of the lot LTA are allocated to the stations A1 to A4 and B1 to B4, and the eight wafers WA are collectively subjected to depositing process. Then, the surface shape measurement apparatus 12 measures the surface shapes of the wafers WA after the deposition of the first stacked bodies (S3). Then, the feature amounts of the first stacked bodies are calculated based on the measurement values of the surface shapes before and after the deposition of the first stacked bodies on the wafers WA (KA1).

The feature amounts of the first stacked bodies are stored in the deposition feature amount database DB1. In addition, the deposition station database DB2 stores information for specifying in which of the stations A1 to A4 and B1 to B4 in which of the chambers CA and CB the first stacked bodies have been deposited on the eight wafers WA. In one lot LTA, when a plurality of wafers WA is subjected in sequence to depositing process in the stations A1 to A4 and B1 to B4, the average of the feature amounts of the first stacked bodies may be taken, or the median value of the same may be taken, or the mode value of the same may be taken in the respective stations A1 to A4 and B1 to B4.

Next, the depositing apparatus 14 deposits the second stacked bodies on the first stacked bodies on the wafers WA (S4). In this case, the eight wafers WA of the lot LTA are allocated to the stations A1 to A4 and B1 to B4, and the eight wafers WA are collectively subjected to depositing process. At the deposition of the second stacked bodies, the wafers WA can be allocated to the same stations A1 to A4 and B1 to B4 as those at the deposition of the first stacked bodies. Alternatively, at the deposition of the second stacked bodies, the wafers WA may be allocated at random to the stations A1 to A4 and B1 to B4 independently of those at the deposition of the first stacked bodies.

Next, the surface shape measurement apparatus 12 measures the surface shapes of the wafers WA after the deposition of the second stacked bodies (S5). Then, the feature amounts of the second stacked bodies are calculated based on the measurement values of the surface shapes before and after the deposition of the second stacked bodies on the wafers WA (KA2). The feature amounts of the second stacked bodies are stored in the deposition feature amount database DB1. In addition, the deposition station database DB2 stores information for specifying in which of the stations A1 to A4 and B1 to B4 in which of the chambers CA and CB the second stacked bodies have been deposited on the eight wafers WA. For one lot LTA, a plurality of wafers WA is subjected in sequence to depositing process in the stations A1 to A4 and B1 to B4, the average of the feature amounts of the second stacked bodies may be taken, or the median value of the same may be taken, or the mode value may be taken in the respective stations A1 to A4 and B1 to B4.

As illustrated in FIG. 2C, the information stored in the deposition feature amount database DB1 and the deposition station database DB2 can indicate the correspondence relationships between the feature amounts at the deposition of the first stacked bodies and the feature amounts at the deposition of the second stacked bodies, for the wafers WA in the past lot LTA, in the respective stations A1 to A4 and B1 to B4. For example, in the station A1 of the chamber CA, the feature amount at the deposition of the first stacked body is 4, and the feature amount at the deposition of the second stacked body is 10. In the station A2 of the chamber CA, the feature amount at the deposition of the first stacked body is 6, and the feature amount at the deposition of the second stacked body is 6. In the station A3 of the chamber CA, the feature amount at the deposition of the first stacked body is 8, and the feature amount at the deposition of the second stacked body is 4. In the station A4 of the chamber CA, the feature amount at the deposition of the first stacked body is 10, and the feature amount at the deposition of the second stacked body is 8.

In the station B1 of the chamber CB, the feature amount at the deposition of the first stacked body is 6, and the feature amount at the deposition of the second stacked body is 6. In the station B2 of the chamber CB, the feature amount at the deposition of the first stacked body is 10, and the feature amount at the deposition of the second stacked body is 10. In the station B3 of the chamber CB, the feature amount at the deposition of the first stacked body is 8, and the feature amount at the deposition of the second stacked body is 8. In the station B4 of the chamber CB, the feature amount at the deposition of the first stacked body is 4, and the feature amount at the deposition of the second stacked body is 4.

When the correspondence relationships between the feature amounts at the deposition of the first stacked bodies and the feature amounts at the deposition of the second stacked bodes are determined, the stations of the chambers in which the feature amounts at the deposition of the second stacked bodies satisfy the evaluation formula relative to the feature amounts at the deposition of the first stacked bodies can be selected as illustrated in FIG. 2D. In this case, it is assumed that the evaluation formula is set such that the difference between the feature amount at the deposition of the first stacked body and the feature amount at the deposition of the second stacked body is 2 or less. The evaluation formula is set such that E is ignored and Th=2, $\alpha=1$, and $\beta=1$ in equation (1). In this case, for example, the station A1 of the chamber CA is used for the deposition of the first stacked body. The feature amount at the deposition of the first stacked body in the station A1 of the chamber CA is 4.

Meanwhile, the feature amount at the second stacked body in the station A1 of the chamber CA is 10. The difference between the feature amount at the deposition of the first stacked body in the station A1 of the chamber CA and the feature amount at the deposition of the second stacked body in the station A1 of the chamber CA is 6. That is, when the station A1 of the chamber CA is used for the deposition of the first stacked body, selecting the station A1 of the chamber CA for the deposition of the second stacked body does not satisfy the evaluation formula. Accordingly, the station A1 of the chamber CA cannot be selected for the deposition of the second stacked body.

The feature amount at the second stacked body in the station A2 of the chamber CA is 6. The difference between the feature amount at the deposition of the first stacked body in the station A1 of the chamber CA and the feature amount at the deposition of the second stacked body in the station A2 of the chamber CA is 2. That is, when the station A1 of the chamber CA is used for the deposition of the first stacked body, selecting the station A2 of the chamber CA for the deposition of the second stacked body satisfies the evaluation formula. Accordingly, the station A2 of the chamber CA can be selected for the deposition of the second stacked body.

The feature amount at the second stacked body in the station A3 of the chamber CA is 4. The difference between the feature amount at the deposition of the first stacked body in the station A1 of the chamber CA and the feature amount at the deposition of the second stacked body in the station A3 of the chamber CA is 0. That is, when the station A1 of the chamber CA is used for the deposition of the first stacked body, selecting the station A3 of the chamber CA for the deposition of the second stacked body satisfies the evaluation formula. Accordingly, the station A3 of the chamber CA can be selected for the deposition of the second stacked body.

The feature amount at the second stacked body in the station A4 of the chamber CA is 8. The difference between the feature amount at the deposition of the first stacked body in the station A1 of the chamber CA and the feature amount at the deposition of the second stacked body in the station A4 of the chamber CA is 4. That is, when the station A1 of the chamber CA is used for the deposition of the first stacked body, selecting the station A4 of the chamber CA for the deposition of the second stacked body does not satisfy the evaluation formula. Accordingly, the station A4 of the chamber CA cannot be selected for the deposition of the second stacked body.

The feature amount at the second stacked body in the station B1 of the chamber CB is 6. The difference between the feature amount at the deposition of the first stacked body in the station A1 of the chamber CA and the feature amount at the deposition of the second stacked body in the station B1 of the chamber CB is 2. That is, when the station A1 of the chamber CA is used for the deposition of the first stacked body, selecting the station B1 of the chamber CB for the deposition of the second stacked body satisfies the evaluation formula. Accordingly, the station B1 of the chamber CB can be selected for the deposition of the second stacked body.

The feature amount at the second stacked body in the station B2 of the chamber CB is 10. The difference between the feature amount at the deposition of the first stacked body in the station A1 of the chamber CA and the feature amount at the deposition of the second stacked body in the station B2 of the chamber CB is 6. That is, when the station A1 of the chamber CA is used for the deposition of the first stacked body, selecting the station B2 of the chamber CB for the deposition of the second stacked body does not satisfy the evaluation formula. Accordingly, the station B2 of the chamber CB cannot be selected for the deposition of the second stacked body.

The feature amount at the second stacked body in the station B3 of the chamber CB is 8. The difference between the feature amount at the deposition of the first stacked body in the station A1 of the chamber CA and the feature amount at the deposition of the second stacked body in the station B3 of the chamber CB is 4. That is, when the station A1 of the chamber CA is used for the deposition of the first stacked body, selecting the station B3 of the chamber CB for the deposition of the second stacked body does not satisfy the evaluation formula. Accordingly, the station B3 of the chamber CB cannot be selected for the deposition of the second stacked body.

The feature amount at the second stacked body in the station B4 of the chamber CB is 4. The difference between the feature amount at the deposition of the first stacked body in the station A1 of the chamber CA and the feature amount at the deposition of the second stacked body in the station B4 of the chamber CB is 0. That is, when the station A1 of the chamber CA is used for the deposition of the first stacked body, selecting the station B4 of the chamber CB for the deposition of the second stacked body satisfies the evaluation formula. Accordingly, the station B4 of the chamber CB can be selected for the deposition of the second stacked body.

Similarly, when the station A2 of the chamber CA is used for the deposition of the first stacked body, the stations A2, A3, and A4 of the chamber CA and the stations B1, B3, and B4 of the chamber CB can be selected, and the station A1 of the chamber CA and the station B2 of the chamber CB cannot be selected for the deposition of the second stacked body.

When the station A3 of the chamber CA is used for the deposition of the first stacked body, the stations A1, A2, and A4 of the chamber CA and the stations B1, B2, and B3 of the chamber CB can be selected, and the station A3 of the chamber CA and the station B4 of the chamber CB cannot be selected for the deposition of the second stacked body.

When the station A4 of the chamber CA is used for the deposition of the first stacked body, the stations A1 and A4 of the chamber CA and the stations B2 and B3 of the chamber CB can be selected, and the stations A2 and A3 of the chamber CA and the stations B1 and B4 of the chamber CB cannot be selected for the deposition of the second stacked body.

When the station B1 of the chamber CB is used for the deposition of the first stacked body, the stations A2, A3, and A4 of the chamber CA and the stations B1, B3, and B4 of the chamber CB can be selected, and the station A1 of the chamber CA and the station B2 of the chamber CB cannot be selected for the deposition of the second stacked body.

When the station B2 of the chamber CB is used for the deposition of the first stacked body, the stations A1 and A4 of the chamber CA and the stations B2 and B3 of the chamber CB can be selected, and the stations A2 and A3 of the chamber CA and the stations B1 and B4 of the chamber CB cannot be selected for the deposition of the second stacked body.

When the station B3 of the chamber CB is used for the deposition of the first stacked body, the stations A1, A2, and A4 of the chamber CA and the stations B1, B2, and B3 of the chamber CB can be selected, and the station A3 of the chamber CA and the station B4 of the chamber CB cannot be selected for the deposition of the second stacked body.

When the station B4 of the chamber CB is used for the deposition of the first stacked body, the stations A2 and A3 of the chamber CA and the stations B1 and B4 of the chamber CB can be selected, and the stations A1 and A4 of the chamber CA and the stations B2 and B3 of the chamber CB cannot be selected for the deposition of the second stacked body.

Next, wafers WB in a present lot LTB are subjected to depositing process. The surface shape measurement apparatus 12 measures the surface shapes of the wafers WB before the deposition of the first stacked bodies (S1). Next, the depositing apparatus 14 deposits the first stacked bodies on the wafers WB (S2). In this case, the eight wafers WB in the lot LTB are allocated to the stations A1 to A4 and B1 to B4 in the chambers CA and CB, and the eight wafers WB are collectively subjected to depositing process. The eight wafers WB can be assigned as wafer IDs 1 to 8. The wafers WB with wafer IDs of 1 to 4 can be allocated to the stations A1 to A4 in the chamber CA, and the wafers WB with the wafer IDs of 5 to 8 can be allocated to the stations B1 to B4 in the chamber CB.

Next, the surface shape measurement apparatus 12 measures the surface shapes of the wafers WB after the deposition of the first stacked bodies (S3). Then, the surface shape measurement apparatus 12 calculates the feature amounts of the first stacked bodies based on the measurement values of the surface shapes before and after the deposition of the first stacked bodies on the wafers WB (KB1). The feature amounts of the first stacked bodies are sent to the host computer 11. In addition, information for specifying in which of the stations A1 to A4 and B1 to B4 in which of the chambers CA and CB the first stacked bodies have been deposited on the eight wafers WB is also sent to the host computer 11.

Next, the depositing apparatus 14 deposits the second stacked bodies on the first stacked bodies on the wafers WB (S4). At that time, the eight wafers WB in the lot LTB are allocated to the stations A1 to A4 and B1 to B4, and the eight wafers WB are connectively subjected to depositing process. The relation between the feature amounts at the deposition of the first stacked bodies on the wafers WB in the lot LTB and the feature amounts at the deposition of the first stacked bodies on the wafers WA in the lot LTA is evaluated. Based on the feature amounts at the deposition of the first stacked bodies and the feature amounts at the deposition of the second stacked bodies on the wafers WA in the lot LTA in relation to the feature amounts at the deposition of the first stacked bodies on the wafers WB in the lot LTB, it is possible to select the stations in the chambers in which the feature amounts at the deposition of the second stacked bodies satisfy the evaluation formula relative to the feature amounts at the deposition of the first stacked bodies on the wafers WB in the lot LTB.

For example, when the feature amounts at the deposition of the first stacked bodies on the wafers WB in the lot LTB and the feature amounts at the deposition of the first stacked bodies on the wafer WA in the lot LTA are equal, for example, it can be evaluated that the feature amounts at the deposition of the first stacked bodies on the wafers WB in the lot LTB and the feature amounts at the deposition of the first stacked bodies on the wafer WA in the lot LTA are related to each other.

When the feature amounts at the deposition of the first stacked bodies on the wafers WB in the lot LTB and the feature amounts at the deposition of the first stacked bodies on the wafers WA in the lot LTA are different, the stations in the chambers providing the feature amounts at the deposition of the first stacked bodies on the wafers WA in the lot LTA closest to the feature amounts at the deposition of the first stacked bodies on the wafers WB in the lot LTB can be selected.

For example, the feature amounts at the deposition of the first stacked bodies on the wafers WB in the lot LTB are 4, 6, 8, 10, 6, 10, 8, and 4 in the stations A1 to A4 and B1 to B4, respectively. In this case, in the stations A1 to A4 and B1 to B4, the feature amounts at the deposition of the first stacked bodies on the wafers WB in the lot LTB and the feature amounts at the deposition of the first stacked bodies on the wafers WA in the lot LTA are equal. Accordingly, based on the correspondence relationships between the feature amounts at the deposition of the first stacked bodies and the feature amounts at the deposition of the second stacked bodies on the wafers WA in the lot LTA, the chambers in the stations in which the feature amounts at the deposition of the second stacked bodies satisfy the evaluation formula relative to the feature amounts at the deposition of the first stacked bodies on the wafers WB in the lot LTB can be selected.

For example, the wafer WB with wafer ID of 1 is allocated to the station A2 in the chamber CA, the wafer WB with wafer ID of 2 is allocated to the station A3 in the chamber CA, the wafer WB with wafer ID of 3 is allocated to the station A4 in the chamber CA, the wafer WB with wafer ID of 4 is allocated to the station A1 in the chamber CA, the wafer WB with wafer ID of 5 is allocated to the station B1 in the chamber CB, the wafer WB with wafer ID of 6 is allocated to the station B2 in the chamber CB, the wafer WB with wafer ID of 7 is allocated to the station B3 in the chamber CB, and the wafer WB with wafer ID of 8 is allocated to the station B4 in the chamber CB.

Meanwhile, the feature amounts at the deposition of the first stacked bodies on the wafers WB in the lot LTB are 4, 6, 8, 10, 4, 8, 6, and 4 in the stations A1 to A4 and B1 to B4. In this case, in the stations B1 to B3 of the chamber CB, the feature amounts at the deposition of the first stacked bodies on the wafers WB in the lot LTB and the feature amounts at the deposition of the first stacked bodies on the wafers WA in the lot LTA are different. Accordingly, the stations in the chambers providing the feature amounts at the deposition of the first stacked bodies on the wafers WA in the lot LTA closer to the feature amounts at the deposition of the first stacked bodies on the wafers WB in the lot LTB are selected. That is, the first stacked bodies are actually deposited on the wafers WB with wafer IDs of 5 to 7 in the stations B1 to B3 of the chamber CB. In this case, in the stations B1 to B3 of the chamber CB, the differences between the feature amounts at the deposition of the first stacked bodies on the wafers WB in the lot LTB and the feature amounts at the deposition of the first stacked bodies on the wafers WA in the lot LTA are 2.

Meanwhile, the first stacked bodies are deposited on the wafers WB with wafer IDs of 5 to 7 in the stations A1, A3, and A2 of the chamber CA. In this case, in the stations A1, A3, and A2 of the chamber CA, the feature amounts at the deposition of the first stacked bodies on the wafers WB in the lot LTB and the feature amounts at the deposition of the first stacked bodies on the wafers WA in the lot LTA is 0.

Accordingly, as for the wafer WB with wafer ID of 5, although the deposition of the first stacked body is actually performed in the station B1 of the chamber CB, the deposition of the first stacked body can be provisionally regarded as being performed in the station A1 of the chamber CA. In addition, for the deposition of the second stacked body on the wafer WB with wafer ID of 5, it is possible to select any one of the stations A2 and A3 in the chamber CA and the stations B1 and B4 in the chamber CB that are selectable for the deposition of the second stacked body when the station A1 of the chamber CA is used for the deposition of the first stacked body.

As for the wafer WB with wafer ID of 6, although the deposition of the first stacked body is actually performed in the station B2 of the chamber CB, the deposition of the first stacked body can be provisionally regarded as being performed in the station A3 of the chamber CA. In addition, for the deposition of the second stacked body on the wafer WB with wafer ID of 6, it is possible to select any one of the stations A1, A2, and A4 in the chamber CA and the stations B1, B2, and B3 in the chamber CB that are selectable for the deposition of the second stacked body when the station A3 of the chamber CA is used for the deposition of the first stacked body.

As for the wafer WB with wafer ID of 7, although the deposition of the first stacked body is actually performed in the station B3 of the chamber CB, the deposition of the first stacked body can be provisionally regarded as being performed in the station A2 of the chamber CA. In addition, for the deposition of the second stacked body on the wafer WB with wafer ID of 7, it is possible to select any one of the stations A2, A3, and A4 in the chamber CA and the stations B1, B3, and B4 in the chamber CB that are selectable for the deposition of the second stacked body when the station A2 of the chamber CA is used for the deposition of the first stacked body.

FIGS. 3A to 3D are diagrams illustrating an allocating method of wafers to the stations to which the deposition supporting system according to the first embodiment is applied. FIGS. 3A to 3D illustrate misalignments at predetermined points on the wafers by arrows. The lengths of the arrows indicate the magnitudes of the misalignments, and the directions shown by the arrows indicate the directions of the misalignments. The arrows may indicate stresses.

Figure 3:
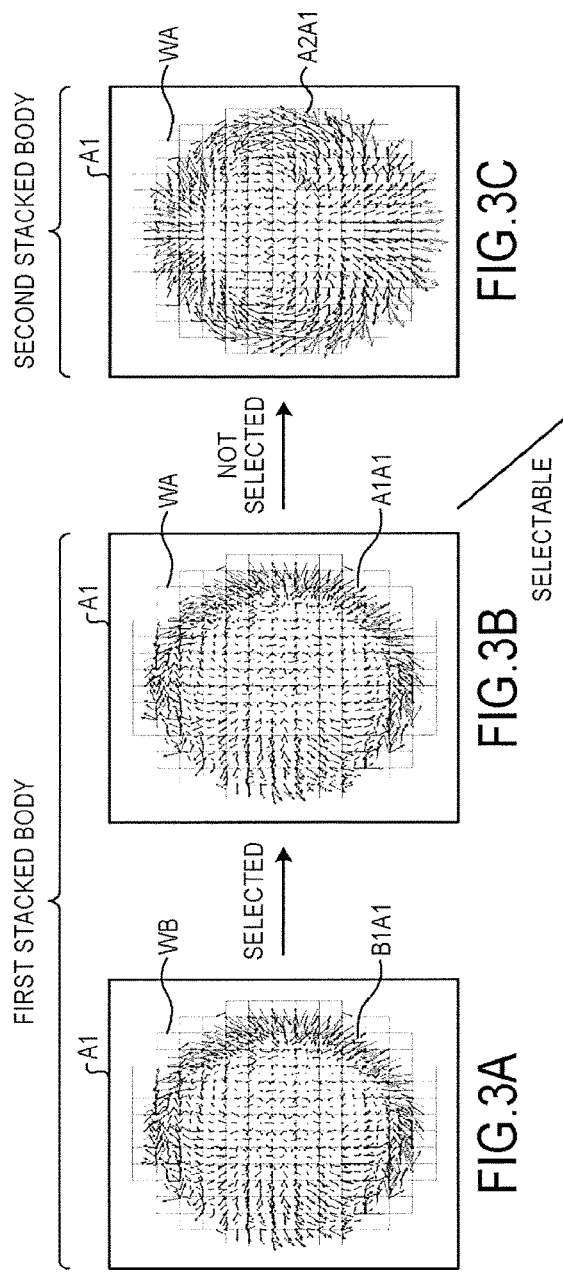
FIGS. 3A to 3D are diagrams illustrating an example of an allocating method of wafers to the stations to which the deposition supporting system according to the first embodiment is applied.

As illustrated in FIG. 3A, in the present lot LTB, the first stacked body is deposited on the wafer WB in the station A1. At that time, a misalignment B1A1 of the first stacked body occurs on the wafer WB.

Meanwhile, as illustrated in FIG. 3B, in the past lot LTA, the first stacked body is deposited on the wafer WA in the station A1. At that time, a misalignment A1A1 of the first stacked body occurs on the wafer WA.

In the station A1, feature amounts convertible to the misalignments B1A1 and A1A1 are calculated. When these feature amounts are equal, the station A1 is selected as a reference destination of feature amounts at the deposition of the first stacked bodies to select the stations A1 to A4 and B1 to B4 for the deposition of the second stacked bodies on the wafers WB.

As illustrated in FIG. 3C, in the past lot LTA, the second stacked body is deposited on the first stacked body on the wafer WA in the station A1. At that time, a misalignment A2A1 of the second stacked body occurs on the first stacked body on the wafer WA. When the feature amount convertible to the misalignment A2A1 does not satisfy the evaluation formula relative to the feature amount convertible to the misalignment A1A1, the station A1 cannot be selected for the deposition of the second stacked body on the wafer WB.

As illustrated in FIG. 3D, in the past lot LTA, the second stacked body is deposited on the first stacked body on the wafer WA in the station A2. At that time, a misalignment A2A2 of the second stacked body occurs on the first stacked body on the wafer WA. When the feature amount convertible to the misalignment A2A2 satisfies the evaluation formula relative to the feature amount convertible to the misalignment A1A1, the station A2 can be selected for the deposition of the second stacked body on the wafer WB.

FIGS. 4A to 4E are diagrams illustrating another example of an allocating method of wafers to the stations to which the deposition supporting system according to the first embodiment is applied. FIGS. 4A to 4D illustrate misalignments at predetermined points on the wafers by arrows. The lengths of the arrows indicate the magnitudes of the misalignments, and the directions shown by the arrows indicate the directions of the misalignments. The arrows may indicate stresses.

Figure 4:
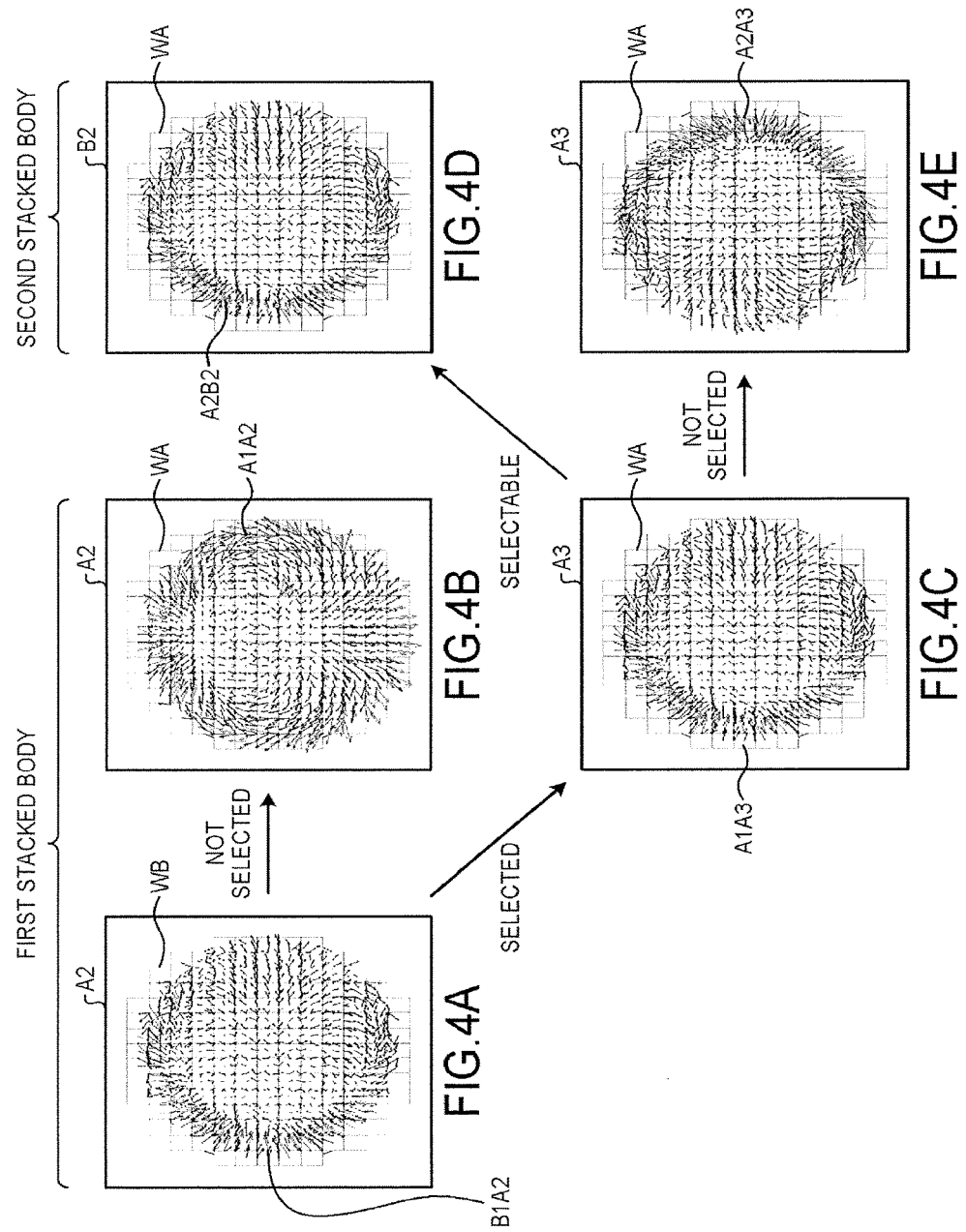
FIGS. 4A to 4E are diagrams illustrating another example of an allocating method of wafers to the stations to which the deposition supporting system according to the first embodiment is applied.

As illustrated in FIG. 4A, in the present lot LTB, the first stacked body is deposited on the wafer WB in the station A2. At that time, a misalignment B1A2 of the first stacked body occurs on the wafer WB.

Meanwhile, as illustrated in FIG. 4B, in the past lot LTA, the first stacked body is deposited on the wafer WA in the station A2. At that time, a misalignment A1A2 of the first stacked body occurs on the wafer WA.

In addition, as illustrated in FIG. 4C, in the past lot LTA, the first stacked body is deposited on the wafer WA in the station A3. At that time, a misalignment A1A3 of the first stacked body occurs on the wafer WA.

In this case, for the station A2, feature amounts convertible to the misalignments B1A2 and A1A2 are calculated. In addition, for the station A3, a feature amount convertible to the misalignment A1A3 is calculated. The feature amounts convertible to the misalignments B1A2 and A1A2 are different, and the feature amount convertible to the misalignment A1A3 in the station A3 is closest to the feature amount convertible to the misalignment B1A1. In this case, even though the deposition of the first stacked body on the wafer WB is actually performed in the station A2, the station A3 is selected as a reference destination of the feature amounts at the deposition of the first stacked bodies to select the stations A1 to A4 and B1 to B4 for the deposition of the second stacked bodies on the wafers WB.

As illustrated in FIG. 4E, in the past lot LTA, the second stacked body is deposited on the wafer WA in the station A3. At that time, a misalignment A2A3 of the second stacked body occurs on the wafer WA. When the feature amount convertible to the misalignment A2A3 does not satisfy the evaluation formula relative to the feature amount convertible to the misalignment A1A3, the station A3 cannot be selected for the deposition of the second stacked body on the wafer WB.

As illustrated in FIG. 4D, in the past lot LTA, the second stacked body is deposited on the wafer WA in the station B2. At that time, a misalignment A2B2 of the second stacked body occurs on the wafer WA. When the feature amount convertible to the misalignment A2B2 satisfies the evaluation formula relative to the feature amount convertible to the misalignment A1A3, the station B2 can be selected for the deposition of the second stacked body on the wafer WB.

Figure 5:
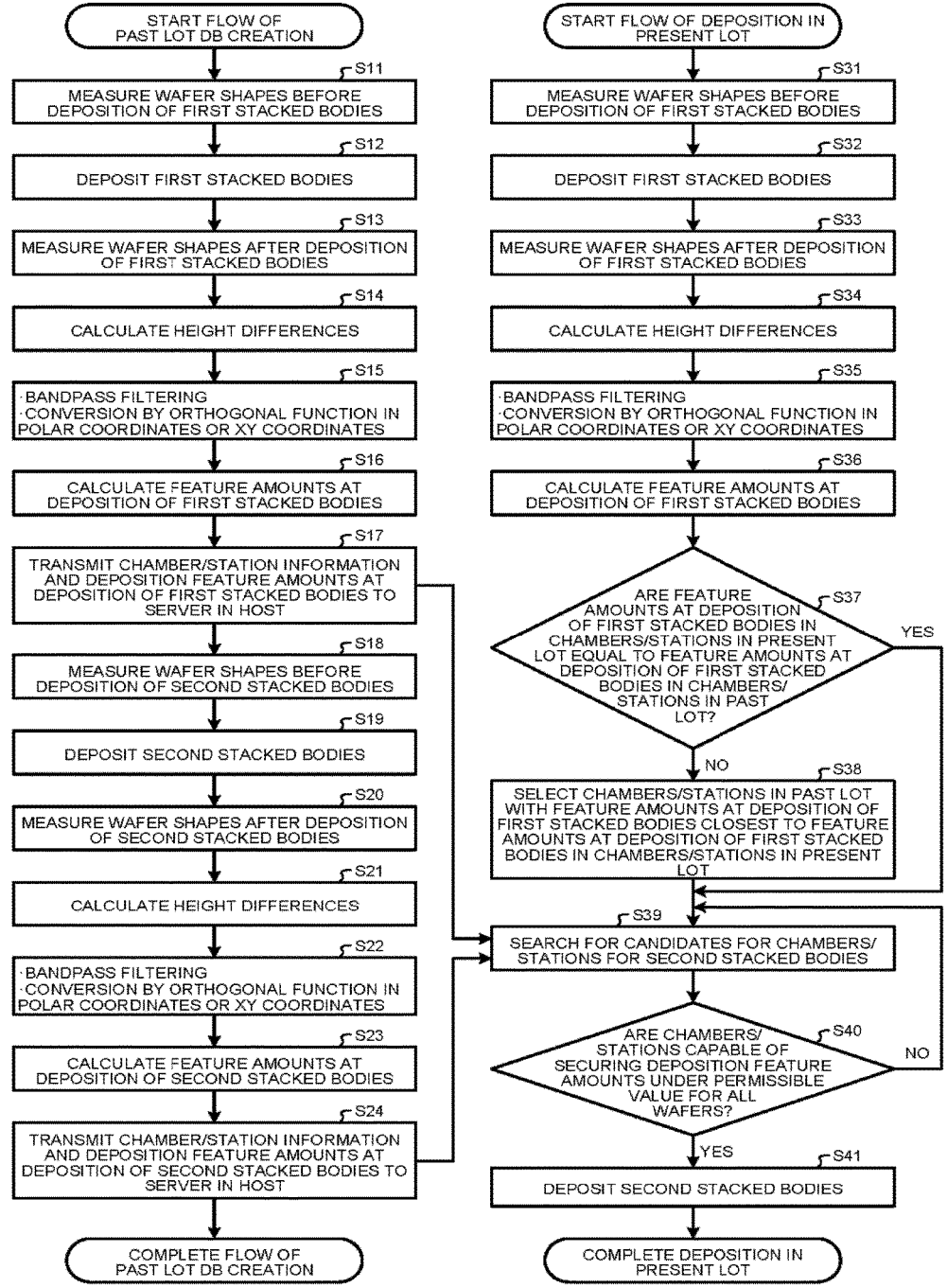
FIG. 5 is a flowchart illustrating a depositing method to which the deposition supporting system according to the first embodiment is applied.

FIG. 5 is a flowchart of a depositing method to which the deposition supporting system according to the first embodiment is applied.

Referring to FIG. 5, in the past lot LTA, the surface shape measurement apparatus 12 measures the surface shapes of the wafers WA before the deposition of the first stacked bodies (S11). Next, the depositing apparatus 14 deposits the first stacked bodies on the wafers WA (S12). The surface shape measurement apparatus 12 measures the surface shapes of the wafers WA after the deposition of the first stacked bodies (S13). Then, height differences are calculated from the measurement values of the surface shapes of the wafers WA before and after the deposition of the first stacked bodies (S14). The height differences are subjected to band-pass filtering to extract predetermined spatial frequency components.

After that, the height differences among the first stacked bodies having undergone the band-pass filtering are converted to orthogonal functions in which the height differences are expressed by the functions of a XY coordinate system or a polar coordinate system (S15), and feature amounts convertible to nano-topographies, misalignments, stresses, or the like are calculated (S16). The feature amounts of the first stacked bodies are transmitted together with the information for specifying the chambers/stations for the deposition to a server in the host computer 11 (S17).

Next, in the past lot LTA, the surface shape measurement apparatus 12 measures the surface shapes of the first stacked bodies on the wafers WA before the deposition of the second stacked bodies (S18). Next, the depositing apparatus 14 deposits the second stacked bodies on the wafers WA (S19). The surface shape measurement apparatus 12 measures the surface shapes of the wafers WA after the deposition of the second stacked bodies (S20). Then, height differences are calculated from the measurement values of the surface shapes of the wafers WA before and after the deposition of the second stacked bodies (S21).

The height differences are subjected to band-pass filtering to extract predetermined spatial frequency components. After that, the height differences among the second stacked bodies having undergone the band-pass filtering are converted to orthogonal functions in which the height differences are expressed by the functions of a XY coordinate system or a polar coordinate system (S22), and feature amounts convertible to nano-topographies, misalignments, stresses, or the like are calculated (S23). The feature amounts of the second stacked bodies are transmitted together with the information for specifying the chambers/stations for the deposition to the server in the host computer 11 (S24). By the foregoing processes, the correspondence relationships between the feature amounts at the deposition of the first stacked bodies and the feature amounts at the deposition of the second stacked bodies in the past lot LTA are held in the host computer 11.

Next, in the present lot LTB, the surface shape measurement apparatus 12 measures the surface shapes of the wafers WB before the deposition of the first stacked bodies (S31). Next, the depositing apparatus 14 deposits the first stacked bodies on the wafers WB (S32). The surface shape measurement apparatus 12 measures the surface shapes of the wafers WB after the deposition of the first stacked bodies (S33). Then, height differences are calculated from the measurement values of the surface shapes of the wafers WB before and after the deposition of the first stacked bodies (S34). The height differences are subjected to band-pass filtering to extract predetermined spatial frequency components. After that, the height differences among the first stacked bodies having undergone the band-pass filtering are converted to orthogonal functions in which the height differences are expressed by the functions of a XY coordinate system or a polar coordinate system (S35), and feature amounts convertible to nano-topographies, misalignments, stresses, or the like are calculated (S36).

Next, it is determined whether the feature amounts at the deposition of the first stacked bodies in the lot LTB in the stations A1 to A4 and B1 to B4 and the feature amounts at the deposition of the first stacked bodies in the lot LTA in the stations A1 to A4 and B1 to B4 are equal (S37). When the feature amounts at the deposition of the first stacked bodies in the lot LTB in the stations A1 to A4 and B1 to B4 and the feature amounts at the deposition of the first stacked bodies in the lot LTA in the stations A1 to A4 and B1 to B4 are equal, the same stations A1 to A4 and B1 to B4 as those used for the deposition of the first stacked bodies in the lot LTB are selected as reference destinations of the feature amounts at the deposition of the first stacked bodies.

Then, when the feature amounts in the stations A1 to A4 and B1 to B4 used for the deposition of the second stacked bodies in the lot LTA satisfy the evaluation formula relative to the feature amounts in the stations A1 to A4 and B1 to B4 used for the deposition of the first stacked bodies in the lot LTB, the stations A1 to A4 and B1 to B4 can be selected for the deposition of the second stacked bodies on the wafers WB (S39).

Next, it is determined whether all the wafers WB subjected to deposition in the stations A1 to A4 and B1 to B4 satisfy the evaluation formula (S40). When all the wafers WB satisfy the evaluation formula, the second stacked bodies are deposited on all the wafers WB in the stations A1 to A4 and B1 to B4 (S41). When any of the wafers WB does not satisfy the evaluation formula, the process returns to S39 to change the selected combination of the stations A1 to A4 and B1 to B4 such that all the wafers WB satisfy the evaluation formula.

On the other hand, when the feature amounts at the deposition of the first stacked bodies in the lot LTB in the stations A1 to A4 and B1 to B4 and the feature amounts at the deposition of the first stacked bodies in the lot LTA in the stations A1 to A4 and B1 to B4 are different, the stations A1 to A4 and B1 to B4 in the lot LTA closest to the feature amounts in the stations A1 to A4 and B1 to B4 used for the deposition of the first stacked bodies in the lot LTB are selected as a reference destination of the feature amounts at the deposition of the first stacked bodies (S38), and the process moves to S39.

In the first embodiment described above, deposition is carried out simultaneously in all the stations A1 to A4 and B1 to B4. Alternatively, deposition may be carried out separately in the chambers CA and CB. In this case, the stations A1 to A4 in which the second feature amounts at the deposition of the second stacked bodies satisfy the evaluation formula relative to the feature amounts at the deposition of the first stacked bodies are allocated to the four wafers, and deposition is carried out in the chamber CA. In addition, the stations B1 to B4 in which the second feature amounts at the deposition of the second stacked bodies satisfy the evaluation formula relative to the feature amounts at the deposition of the first stacked bodies are allocated to the four wafers, and deposition is carried out in the chamber CB.

In the first embodiment, the same depositing apparatus 14 is used for the deposition of the first stacked bodies and the deposition of the second stacked bodies. Alternatively, different depositing apparatuses 14 may be used for deposition of the first stacked bodies and the deposition of the second stacked bodies.

A calculating method of feature amounts at the deposition of the first stacked bodies and the second stacked bodies will be explained below.

Height difference at each measurement point between before and after the deposition on a wafer is designated as dz. When a radial direction is designated as $\rho$ and an angular direction as θ in a polar coordinate system in the wafer plane, the height difference dz can be explained as dz=W(ρ, θ).

The height difference dz can be subjected to conversion by an orthogonal function typified by a Zernike polynomial to obtain the following equation (5):

$$W(\rho,\theta)=\Sigma\Sigma K_{nm}Z_{nm}(\rho,\theta) \quad (5)$$

where
$K_{nm}$ represents a Zernike coefficient;
$Z_{nm}(\rho, \theta)$ represents a Zernike polynomial;
n represents a x-direction degree; and
m represents a y-direction degree.

The Zernike coefficient $K_{nm}$ can be set as feature amount.

The height difference dz may be subjected to frequency response analysis in the radial direction ρ and the feature amount may be determined from a nano-topography dz' having undergone band-pass filtering by which only a frequency component in the radial direction ρ is extracted.

The height difference dz or the nano-topography dz' can be differentiated in the x direction or the y direction to obtain in-plane distortion (IPD). The IPD can be expressed as follows in the XY coordinate system in the wafer plane:

$$DX=dz/dx \text{ or } DX=dz'/dx$$

$$DY=dz/dy \text{ or } DY=dz'/dy$$

The IPD at each measurement points can be substituted into the following equations (6) and (7) to determine k parameters $k_1$ to $k_{20}$ and residual components A and B by the method of least squares:

$$DX=k_1+k_3x+k_5y+k_7x^2+k_9xy+k_{11}y^2+k_{13}x^3+k_{15}x^2y+k_{17}xy^2+k_{19}y^3 \quad (6)$$

$$DY=k_2+k_4y+k_6x+k_8y^2+k_{10}xy+k_{12}x^2+k_{14}y^3+k_{16}xy^2+k_{18}x^2y+k_{20}x^3 \quad (7)$$

The parameters $k_1$ to $k_{20}$ and the residual components A and B may be set as feature amounts.

The IPD can be differentiated in the x direction or the y direction to obtain a stress σ. With regard to the stress σ, the height difference dz can be differentiated twice in the x direction or the y direction to obtain the following equations:

$$\sigma_{XX}=d^2z/dx^2$$

$$\sigma_{XY}=d^2z/dxdy$$

$$\sigma_{YY}=d^2z/dy^2$$

Alternatively, the nano-topography dz' can be differentiated twice in the x direction or the γ direction to obtain the following equations:

$$\sigma'_{XX}=d^2z'/dx^2$$

$$\sigma'_{XY}=d^2z'/dxdy$$

$$\sigma'_{YY}=d^2z'/dy^2$$

The stresses σ and σ' may be set as feature amounts.

Alternatively, a curvature change Δκ between before and after the deposition on the wafer may be determined from the surface shapes at each measurement point before and after the deposition, and the stress a may be determined from a Stoney equation. In this case, the relationship between the stress σ and the curvature change Δκ can be given by the following equation:

$$\sigma=E_st_s^2\Delta\kappa/(6t_F)$$

where
$E_s$ represents Young's modulus of the wafer;
$t_s$ represents the thickness of the wafer; and
$t_F$ represents the thickness of the stacked body on the wafer.

The curvature change Δκ may be subjected to conversion by an orthogonal function typified by a Zernike polynomial, and the coefficient at that time may be set as feature amount. The curvature change Δκ can be differentiated in the x direction or the y direction, and the resultant value can be substituted into the equations (6) and (7). Then, parameters $k_1$ to $k_{20}$ and residual components A and B may be determined by the method of least squares, and the determined parameters $k_1$ to $k_{20}$ and residual components A and B may be determined as feature amounts.

Figure 6:
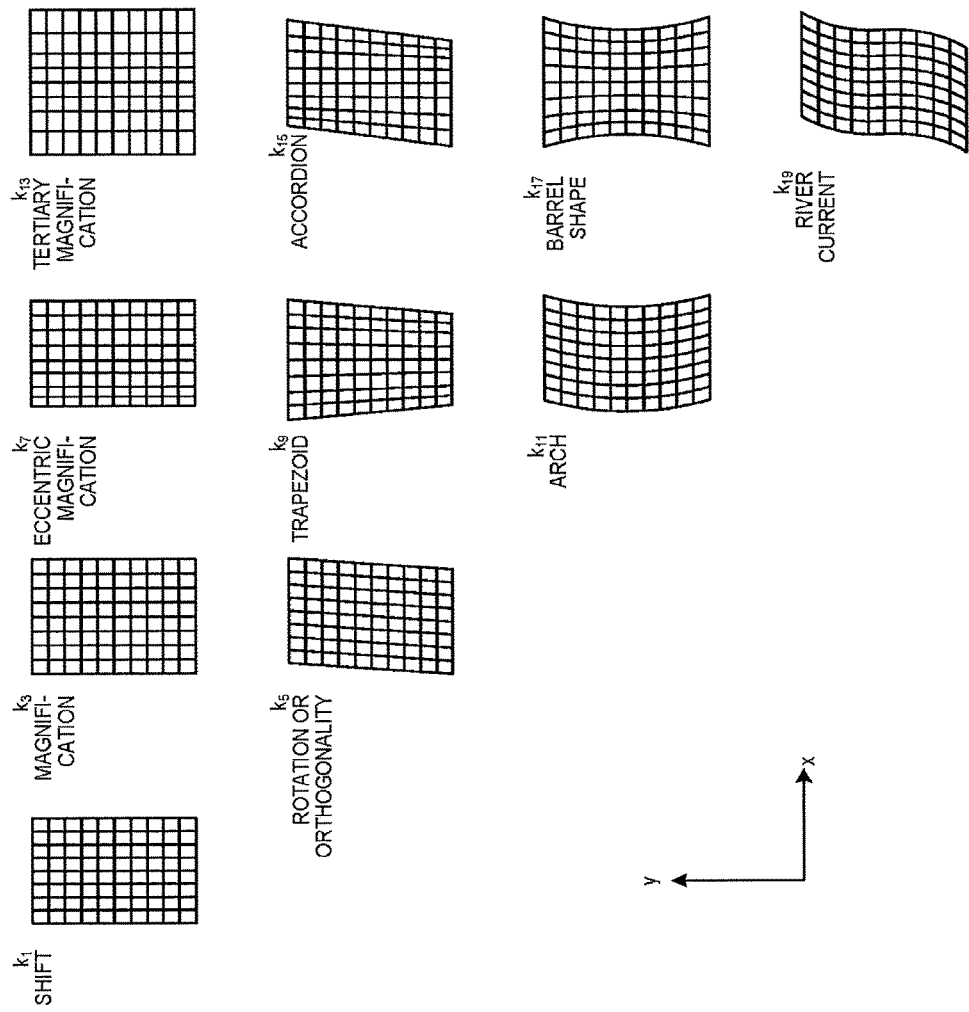
FIG. 6 is a diagram illustrating misalignment components in an x-axis direction of xy coordinates that can be used for feature amounts.

FIG. 6 is a diagram illustrating misalignment components in an x-axis direction of xy coordinates that can be used for feature amounts.

Referring to FIG. 6, $k_1$ represents a shift component in the x-axis direction, $k_3$ a magnification component in the x-axis direction, $k_5$ a rotation component in the x-axis direction (or an orthogonality component in the x-axis direction), $k_7$ an eccentric magnification component in the x-axis direction, $k_9$ a trapezoid component in the x-axis direction, $k_{11}$ an arch component in the x-axis direction, $k_{13}$ a tertiary magnification component in the x-axis direction, $k_{15}$ an accordion component in the x-axis direction, $k_{17}$ barrel shape component in the x-axis direction, and $k_{19}$ a river current component in the x-axis direction.

Figure 7:
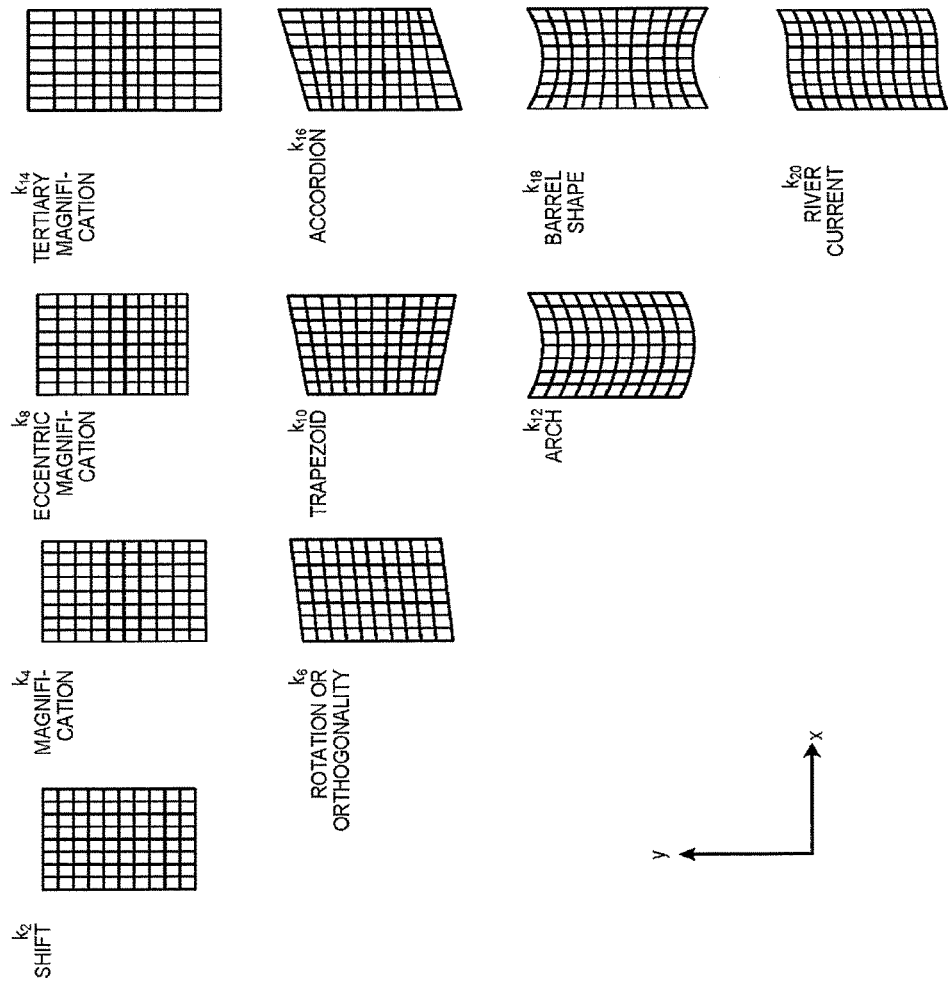
FIG. 7 is a diagram illustrating misalignment components in a y-axis direction of the xy coordinates that can be used for feature amounts.

FIG. 7 is a diagram illustrating misalignments in a y-axis direction of the xy coordinates that can be used for feature amounts.

Referring to FIG. 7, $k_2$ represents a shift component in the y-axis direction, $k_4$ a magnification component in the y-axis direction, $k_6$ a rotation component in the y-axis direction (or an orthogonality component in the y-axis direction), $k_8$ an eccentric magnification component in the y-axis direction, $k_{10}$ a trapezoid component in the y-axis direction, $k_{12}$ an arch component in the y-axis direction, $k_{14}$ a tertiary magnification component in the y-axis direction, $k_{16}$ an accordion component in the y-axis direction, $k_{18}$ a barrel shape component in the y-axis direction, and $k_{20}$ a river current component in the y-axis direction.

Figure 8:
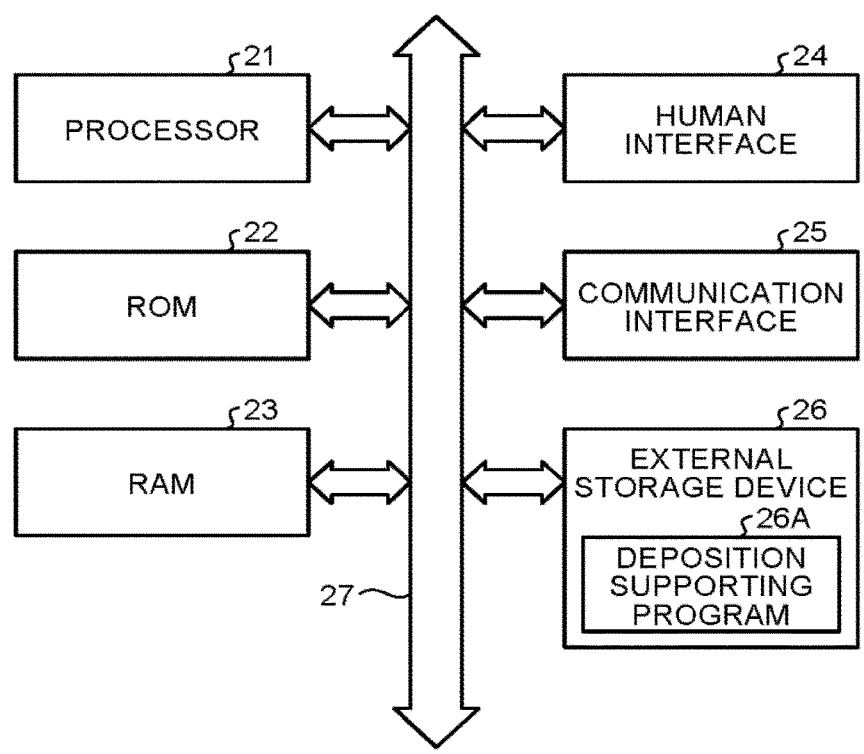
FIG. 8 is a block diagram of a hardware configuration example of a host computer according to the first embodiment.

FIG. 8 is a block diagram of a hardware configuration example of a host computer according to the first embodiment.

Referring to FIG. 8, the host computer 11 illustrated in FIG. 1 can be provided with a processor 21 including a CPU and the like, a ROM 22 storing fixed data, a RAM 23 providing a work area and the like for the processor 21, a human interface 24 mediating between a human and a computer, a communication interface 25 providing units for external communications, and an external storage device 26 storing programs and various data for operating the processor 21. The processor 21, the ROM 22, the RAM 23, the human interface 24, the communication interface 25, and the external storage device 26 are connected together via a bus 27.

The external storage device 26 may be a magnetic disc such as a hard disc, an optical disc such as a DVD, or a portable semiconductor storage device such as a USB memory or a memory card, for example. The human interface 24 may be a keyboard, a mouse, or a touch panel as an input interface, and may be a display, a printer, or the like as an output interface, for example. The communication interface 25 may be a LAN card, a modem, a router, or the like for connection with the internet, a LAN, or the like, for example. The external storage device 26 has a deposition supporting program 26A installed therein to specify stations to which wafers are to be allocated based on the feature amounts of the stacked bodies in the stations of the depositing apparatus. When the deposition supporting program 26A is executed by the processor 21, the stations to which wafers are to be allocated are specified based on the feature amounts of the stacked bodies in the stations of the depositing apparatus.

The deposition supporting program 26A to be executed by the processor 21 may be stored in the external storage device 26 and read into the RAM 23 at the time of execution of the deposition supporting program 26A. The deposition supporting program 26A may be stored in advance in the ROM 22. The deposition supporting program 26A may be acquired via the communication interface 25. The deposition supporting program 26A may be executed by a standalone computer or a cloud computer.

Second Embodiment

Figure 9:
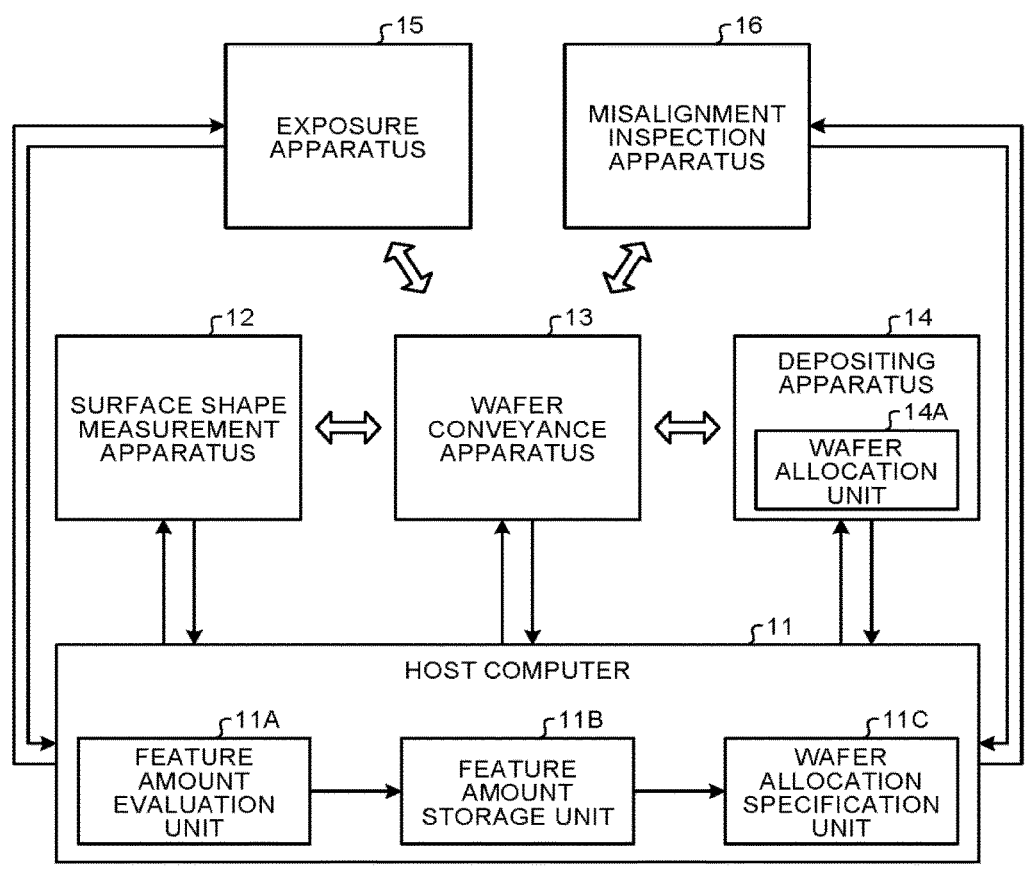
FIG. 9 is a schematic block diagram of a configuration of deposition supporting system according to a second embodiment.

FIG. 9 is a schematic block diagram of a deposition supporting system according to a second embodiment.

In the configuration of FIG. 9, an exposure apparatus 15 and a misalignment inspection apparatus 16 are added to the configuration of FIG. 1. The surface shape measurement apparatus 12, the wafer conveyance apparatus 13, the depositing apparatus 14, the exposure apparatus 15, and the misalignment inspection apparatus 16 can conduct data communications with the host computer 11.

Wafers can be delivered between the surface shape measurement apparatus 12 and the depositing apparatus 14 via the wafer conveyance apparatus 13. Wafers can be delivered between the exposure apparatus 15 and the misalignment inspection apparatus 16 via the wafer conveyance apparatus 13. Wafers can be delivered between the exposure apparatus 15 and the depositing apparatus 14 via the wafer conveyance apparatus 13. Wafers can be delivered between the misalignment inspection apparatus 16 and the depositing apparatus 14 via the wafer conveyance apparatus 13. The exposure apparatus 15 exposes a resist film on a wafer to light via a reticle. The misalignment inspection apparatus 16 inspects a misalignment of overlap inspection marks on the wafer.

In the past lot, wafers are conveyed to the surface shape measurement apparatus 12 before the deposition of the first stacked bodies. The surface shape measurement apparatus 12 measures the surface shapes of the wafers before the deposition of the first stacked bodies, and sends the measurement values to the feature amount evaluation unit 11A. In addition, when the surface shapes of the wafers before the deposition of the first stacked bodies are measured, the wafers are conveyed to the depositing apparatus 14. The depositing apparatus 14 deposits the first stacked bodies on the wafers.

After the deposition of the first stacked bodies, the wafers are conveyed to the surface shape measurement apparatus 12. The surface shape measurement apparatus 12 measures the surface shapes of the wafers after the deposition of the first stacked bodies, and sends the measurement values to the feature amount evaluation unit 11A. The feature amount evaluation unit 11A calculates the feature amounts of the first stacked bodies based on the measurement values of the surface shapes before and after the deposition of the first stacked bodies, and stores the feature amounts in the feature amount storage unit 11B.

In the past lot, when the surface shapes of the wafers after the deposition of the first stacked bodies are measured, the wafers are conveyed to the depositing apparatus 14. The depositing apparatus 14 deposits the second stacked bodies on the first stacked bodies. After the deposition of the second stacked bodies, the wafers are conveyed to the surface shape measurement apparatus 12. The surface shape measurement apparatus 12 measures the surface shapes of the wafers after the deposition of the second stacked bodies, and sends the measurement values to the feature amount evaluation unit 11A.

The feature amount evaluation unit 11A calculates the feature amounts of the second stacked bodies based on the measurement values of the surface shapes before and after the deposition of the second stacked bodies, and stores the feature amounts in the feature amount storage unit 11B. At that time, the feature amount storage unit 11B can hold the correspondence relationships between the feature amounts of the first stacked bodies and the feature amounts of the second stacked bodies in the past lot.

Next, in the present lot, wafers are conveyed to the surface shape measurement apparatus 12 before the deposition of the first stacked bodies. The surface shape measurement apparatus 12 measures the surface shapes of the wafers before the deposition of the first stacked bodies, and sends the measurement values to the feature amount evaluation unit 11A. In addition, when the surface shapes of the wafers before the deposition of the first stacked bodies are measured, the wafers are conveyed to the depositing apparatus 14. The depositing apparatus 14 deposits the first stacked bodies on the wafers.

After the deposition of the first stacked bodies, the wafers are conveyed to the surface shape measurement apparatus 12. The surface shape measurement apparatus 12 measures the surface shapes of the wafers after the deposition of the first stacked bodies, and sends the measurement values to the feature amount evaluation unit 11A. The feature amount evaluation unit 11A calculates the feature amounts of the first stacked bodies based on the measurement values of the surface shapes before and after the deposition of the first stacked bodies, and stores the feature amounts in the feature amount storage unit 11B. The feature amounts may take values obtained by subtracting correctable components at the exposure apparatus 15.

In addition, in the present lot, when the surface shapes of the wafers after the deposition of the first stacked bodies are measured, resist films are applied to the first stacked bodies and the wafers are conveyed to the exposure apparatus 15. The exposure apparatus 15 exposes the resist films on the first stacked bodies to light via a reticle. The exposed resist films are developed to form resist patterns on the first stacked bodies. The wafers with the resist patterns are conveyed to the misalignment inspection apparatus 16. The misalignment inspection apparatus 16 inspects the resist patterns formed on the first stacked bodies for misalignments. When the misalignments fall within a permissible range, the first stacked bodies are etched via the resist patterns to form device patterns to which the resist patterns are transferred on the first stacked bodies. The device patterns may be hole patterns or slit patterns.

Then, based on the correspondence relationships in the past lot stored in the feature amount storage unit 11B, the stations in the chambers in which the feature amounts at the deposition of the second stacked bodies satisfy the evaluation formula relative to the feature amounts at the deposition of the first stacked bodies in the present lot are selected.

The wafer allocation specification unit 11C instructs the depositing apparatus 14 to allocate the wafers to the selected stations. The wafer allocation unit 14A allocates the wafers to the stations based on the specification from the host computer 11. Then, the second stacked bodies are deposited on the first stacked bodies in the stations of the depositing apparatus 14.

In the foregoing embodiment, the surface shapes of the first stacked bodies are measured at the surface shape measurement apparatus 12. Alternatively, the measurement may be performed at the exposure apparatus 15 or the misalignment inspection apparatus 16.

Figure 10:
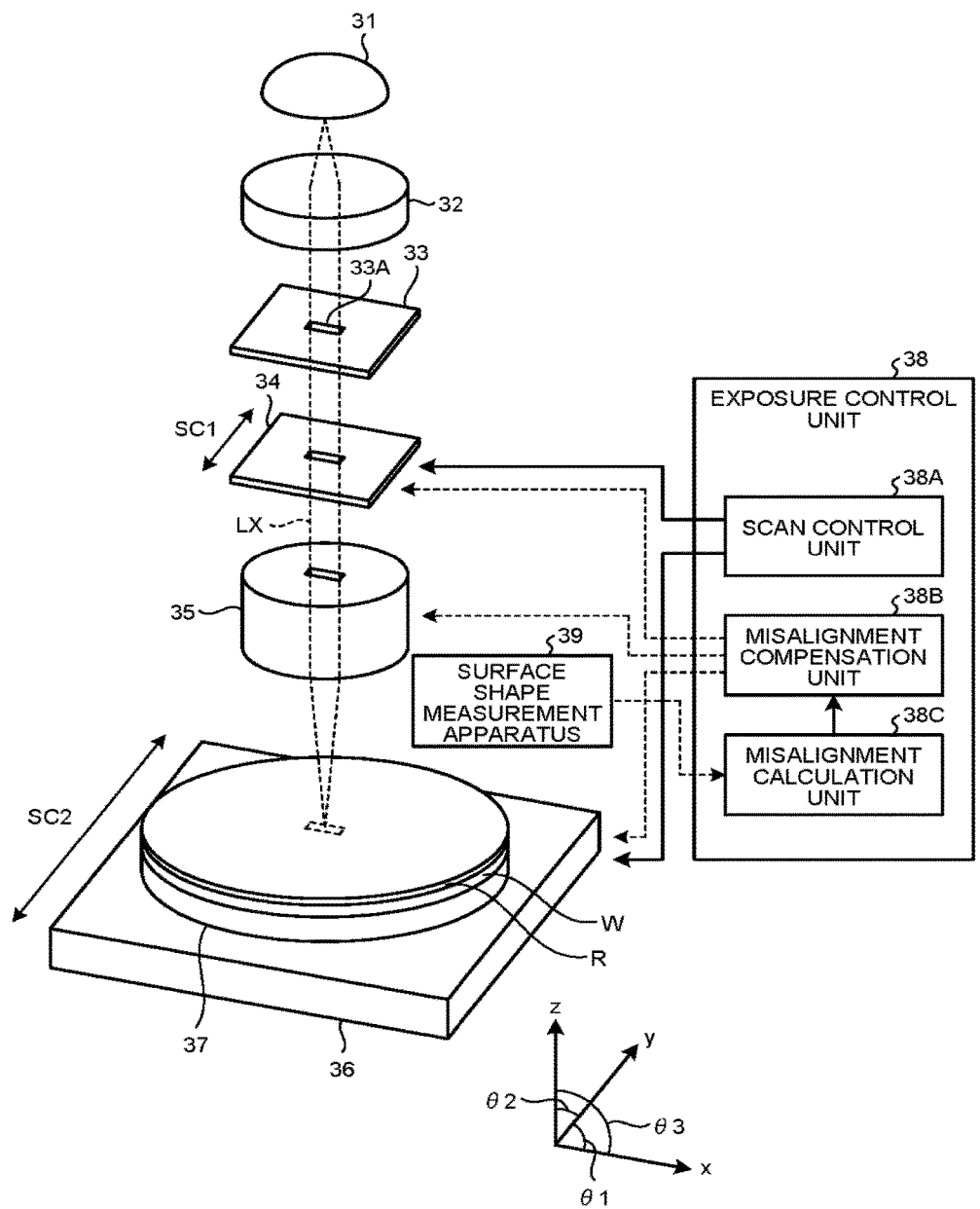
FIG. 10 is a schematic perspective view of a configuration of an exposure apparatus for use in the deposition supporting system according to the second embodiment.

FIG. 10 is a schematic perspective view of the exposure apparatus for use in the deposition supporting system according to the second embodiment.

Referring to FIG. 10, the exposure apparatus 15 includes a light source 31 that emits exposure light LX, an illumination lens 32 that irradiates a reticle 34 with the exposure light LX, a slit plate 33 that shapes the exposure light LX into a slit form, a projection optical system 35 that projects the exposure light LX having passed through the reticle 34 onto a wafer W, and a stage 36 on which the wafer W is placed. A slit 33A is provided on the slit plate 33. A chuck 37 is provided on the stage 36 to fix the wafer W.

A resist film R is applied to the wafer W. The stage 36 can move in an x-axis direction, a y-axis direction, and a z-axis direction. The stage 36 can also rotate in a θ1 direction and incline in a θ2 direction or a θ3 direction. The projection optical system 35 can change the magnification ratio of a projection image projected onto the wafer W. The wavelength of the exposure light LX can be selected from among 365 nm (i line), 248 nm (KrF), 193 nm (ArF), and 13.5 nm (EUV), for example. The exposure apparatus includes a surface shape measurement apparatus 39 that measures the surface shape of the wafer W. The exposure apparatus may include a stress measurement apparatus instead of the surface shape measurement apparatus 39.

The exposure apparatus 15 also includes an exposure control unit 38 that controls exposure of the resist film R on the wafer W. The exposure control unit 38 includes a scan control unit 38A, a misalignment compensation unit 38B, and a misalignment calculation unit 38C. The scan control unit 38A performs a scan control on the reticle 34 and the stage 36. In the scan and repeat mode, a scan SC1 of the reticle 34 and a scan SC2 of the stage 36 can be synchronized with each other. The misalignment calculation unit 38C calculates misalignments at predetermined points in a wafer plane based on the surface shape of the wafer W. The predetermined points may be grid points set in a mesh manner in the wafer plane. The misalignment compensation unit 38B sets K parameters $K_1$ to $K_{20}$ for setting exposure conditions based on the misalignments at the predetermined points in the wafer plane. The exposure conditions can be the scan speed of the stage 36 on the reticle 34, the inclination of the stage 36 relative to the reticle 34, the rotational angle of the stage 36 relative to the reticle 34, and the magnification ratio of a projection image projected onto the wafer W, for example.

When misalignment amounts dx and dy are expressed by xy coordinate orthogonal functions, the K parameters $K_1$ to $K_{20}$ can be given by the following equations (8) and (9). The components of the K parameters $K_1$ to $K_{20}$ are the same as the components of the k parameters $k_1$ to $k_{20}$ as illustrated in FIGS. 6 and 7.

$$dx = K_1 + K_3 x + K_5 y + K_7 x^2 + K_9 xy + K_{11} y^2 + K_{13} x^3 + K_{15} x^2 y + K_{17} xy^2 + K_{19} y^3 \quad (8)$$

$$dy = K_2 + K_4 y + K_6 x + K_8 y^2 + K_{10} xy + K_{12} x^2 + K_{14} y^3 + K_{16} xy^2 + K_{18} x^2 y + K_{20} x^3 \quad (9)$$

The misalignment amounts dx and dy calculated at respective set points on the xy coordinates in the wafer plane are substituted into the equations (8) and (9), and the simultaneous equations are solved to calculate the K parameters $K_1$ to $K_{20}$. The number of the set points on the xy coordinates in the wafer plane can be about several hundreds. At that time, when the number of the set points on the xy coordinates in the wafer plane is too large, the parameters $K_1$ to $K_{20}$ adapted to the misalignment amounts dx and dy at all the set points cannot be calculated. In this case, the K parameters $K_1$ to $K_{20}$ may be calculated such that the fitting residuals in the equations (8) and (9) are minimum. The K parameters $K_1$ to $K_{20}$ may be calculated for each shot area in the wafer plane.

In the present lot, after the first stacked bodies are deposited on the wafers W, the resist films R are applied to the first stacked bodies. Then, the wafers W with the resist films R are conveyed onto the chuck 37. The wafers W are drawn to the chuck 37 to fix the wafers W on the chuck 37. The surface shape measurement apparatus 39 measures the surface shapes of the wafers W, and sends the measurement values to the misalignment calculation unit 38C and the feature amount evaluation unit 11A. The misalignment calculation unit 38C calculates misalignments at predetermined points in the wafer plane based on the measurement values sent from the surface shape measurement apparatus 39, and sends the calculated results to the misalignment compensation unit 38B. The misalignment compensation unit 38B calculates the K parameters $K_1$ to $K_{20}$ based on the misalignments calculated by the misalignment calculation unit 38C.

Next, the light source 31 emits the exposure light LX. The exposure light LX is converted into parallel light by the illumination lens 32, and guided to the slit plate 33 for shaping into a slit form. Then, the exposure light LX shaped in the slit form enters the reticle 34. The exposure light LX having passed through the reticle 34 is projected by the projection optical system 35 onto the wafers W to expose the resist films R to light. In the scan and repeat mode, while the exposure light LX is projected onto the wafers W, the reticle 34 and the stage 36 are scanned in synchronization. At that time, the exposure control unit 38 controls the exposure conditions for the resist films R based on the K parameters $K_1$ to $K_{20}$ calculated by the misalignment compensation unit 38B.

By controlling the exposure conditions for the resist films R based on the K parameters $K_1$ to $K_{20}$, it is possible to improve the accuracy of alignment between the first stacked bodies and the second stacked bodies even when there occur variations in misalignments in the wafer plane between the deposition of the first stacked bodies and the deposition of the second stacked bodies. In addition, providing the surface shape measurement apparatus 39 in the exposure apparatus 15 eliminates the need to convey the wafers W with the first stacked bodies or the second stacked bodies to the surface shape measurement apparatus 12, thereby improving throughput.

Meanwhile, when the measurement values from the surface shape measurement apparatus 39 are sent to the feature amount evaluation unit 11A, the stations in the chambers in which the feature amounts at the deposition of the second stacked bodies satisfy the evaluation formula relative to the feature amounts at the deposition of the first stacked bodies in the present lot are selected based on the correspondence relationships in the past lot stored in the feature amount storage unit 11B. The feature amounts may take values obtained by subtracting misalignment components corrected at the exposure apparatus 15 according to the equations (8) and (9).

The K parameters $K_1$ to $K_{20}$ can be set such that, after the deposition of the first stacked bodies, the misalignments at the predetermined points on the first stacked bodies in the wafer plane come close to zero at the time of exposure of the resist films on the first stacked bodies. Alternatively, the K parameters $K_1$ to $K_{20}$ may be set such that, after the deposition of the second stacked bodies, the misalignments between the first stacked bodies and the second stacked bodies in the wafer plane come close to zero at the time of exposure of the resist films on the second stacked bodies.

FIG. 11A is a schematic cross-sectional view of a misalignment inspection apparatus for use in the deposition supporting system according to the second embodiment, and FIG. 11B is a plane view of an example of misalignment inspection marks detected by an imaging element illustrated in FIG. 11A.

Referring to FIG. 11A, the misalignment inspection apparatus 16 includes a light source 41, an illumination lens 42, a half mirror 43, an object lens 44, an image forming lens 45, an imaging element 46, an image processing apparatus 47, an arithmetic processing apparatus 48, and a stage 49. The light source 41 emits illumination light that illuminates the wafer W.

The wavelength of the illumination light can be set to the visible region or the infrared region. The illumination lens 42 collects the illumination light emitted from the light source 41. The half mirror 43 reflects the illumination light emitted from the wafer W or transmits the reflection light reflected from the wafer W. The object lens 44 collects the illumination light on the wafer W. The image forming lens 45 collects the illumination light on an imaging surface of the imaging element 46. The imaging element 46 takes an image of overlap inspection marks MP1 and MP2 on the wafer W. The imaging element 46 may be a CCD or a CMOS image sensor. The image processing apparatus 47 performs image processing on the image taken by the imaging element 46. The arithmetic processing apparatus 48 calculates the amount of a misalignment between the overlap inspection marks MP1 and MP2 based on the image taken by the imaging element 46. The stage 49 can hold the wafer W. The wafer W has the resist film R thereon. The wafer W has the overlap inspection mark MP1. The resist film R has the overlap inspection mark MP2.

After the exposure of the exposure apparatus 15, the wafer W with the resist pattern is placed on the stage 49. Before conveyance to the misalignment inspection apparatus 16, the overlap inspection mark MP1 is formed on the wafer W, and the overlap inspection mark MP2 is formed on the resist film R.

Then, the light source 41 emits illumination lights that are collected by the illumination lens 42. The illumination light enters the object lens 44 via the half mirror 43 and is collected on the wafer W. When the illumination light enters the overlap inspection marks MP1 and MP2, the illumination light is reflected on the overlap inspection marks MP1 and MP2. When the overlap inspection marks MP1 and MP2 are different in height, the stage 49 may be moved up or down such that the overlap inspection marks MP1 and MP2 align with the focus position of the object lens 44. The reflection light from the overlap inspection marks MP1 and MP2 enters the imaging element 46 via the object lens 44, the half mirror 43, and the image forming lens 45. At that time, mark images MQ1 and MQ2 corresponding to the overlap inspection marks MP1 and MP2 are generated on an imaging surface 46A of the imaging element 46, and are sent to the image processing apparatus 47.

The image processing apparatus 47 extracts the edges of the mark images MQ1 and MQ2. After that, the arithmetic processing apparatus 48 calculates a misalignment between the overlap inspection marks MP1 and MP2 based on the edge positions of the mark images MQ1 and MQ2. When the misalignment falls within a specified range, a surface shape measurement apparatus 50 measures the surface shape of the wafer W, and sends the measurement values to the feature amount evaluation unit 11A. When the surface shape of the wafer W is measured, the wafer W is conveyed to an etching apparatus.

Providing the surface shape measurement apparatus 50 in the misalignment inspection apparatus 16 eliminates the need to convey the wafer W with the first stacked body or the second stacked body to the surface shape measurement apparatus 12, thereby improving throughput.

Third Embodiment

FIGS. 12A to 12D, 13A to 13C, and 14A to 14C are cross-sectional views illustrating a manufacturing method of a semiconductor device according to a third embodiment. FIG. 14D is a cross-sectional view of a configuration example of a memory cell illustrated in FIG. 14C. The third embodiment takes a manufacturing method of an NAND flash memory in which memory cells are arranged three-dimensionally as an example.

Referring to FIG. 12A, a stacked body TA1 is formed on a base layer 61. The stacked body TA1 can be formed by the depositing apparatus 14 illustrated in FIG. 1. The base layer 61 may be a wafer, an insulation layer, or a semiconductor layer. An integrated circuit, wiring, and the like may be formed on the base layer 61. In the stacked body TA1, insulation layers 62 and 63 of different materials are alternately stacked by a method such as CVD. The insulation layers 62 and 63 may be formed from materials different in etching rate.

For example, the insulation layers 62 may be formed from silicon oxide films, and the insulation layers 63 may be formed from silicon nitride films. The film thicknesses of the insulation layers 62 and 63 may be set to about several tens nm, for example. The numbers of the insulation layers 62 and 63 may be set to about several tens to several hundreds, for example. The surface shapes before and after the deposition of the stacked body TA1 can be measured by the surface shape measurement apparatus 12 illustrated in FIG. 1, for example. Then, the host computer 11 can calculate feature amounts of the stacked body TA1 from the surface shapes before and after the deposition of the stacked body TA1.

Next, an insulation layer 64 is formed on the stacked body TA1 by a method such as low pressure chemical vapor deposition (LPCVD).

Next, an advanced patterning film (APF) 65 is formed on the insulation layer 64 by a method such as CVD. The APF 65 can be formed from a material lower in etching rate than the insulation layers 62 to 64. For example, the APF 65 can be formed from a carbon film.

Next, a dielectric anti-reflective coating (DARC) film 66 is formed on the APF 65 by a method such as CVD. The DARC film 66 can be formed from a SiON film, for example.

Next, a resist pattern 67 is formed on the DARC film 66 by the use of a photolithography technique. The resist pattern 67 has an opening 67A. At that time, the exposure apparatus 15 illustrated in FIG. 10 can be used. The position of the opening 67A can be corrected by setting exposure conditions in accordance with the equations (8) and (9).

Next, as illustrated in FIG. 12B, the DARC film 66 and the APF 65 are etched with the resist pattern 67 as a mask to transfer the opening 67A to the DARC film 66 and the APF 65. Then, the stacked body TA1 and the insulation layer 64 are etched with the APF 65 to which the opening 67A is transferred as a mask to form a memory hole MA1 in the stacked body TA1 and the insulation layer 64. The diameter of the memory hole MA1 can be set to several tens nm, for example. After the formation of the memory hole MA1, the APF 65 is removed by a method such as ashing.

Next, as illustrated in FIG. 12C, a sacrifice film 68 is embedded in the memory hole MA1 by a method such as CVD. The sacrifice film 68 can be formed from a material lower in etching rate than the stacked body TA1 and the insulation layer 64. For example, the sacrifice film 68 can be formed from polycrystalline silicon or amorphous silicon.

Next, as illustrated in FIG. 12D, a stacked body TA2 is formed on the insulation layer 64. The stacked body TA2 can be formed by the depositing apparatus 14 illustrated in FIG. 1. At that time, the stations A1 to A4 and B1 to B4 in which feature amounts at the deposition of the stacked bodies TA2 satisfy the evaluation formula relative to the feature amounts at the deposition of the stacked bodies TA1 in the present lot can be selected based on the correspondence relationships between the feature amounts of the stacked bodies TA1 and the feature amounts of the stacked bodies TA2 in the past lot.

In the stacked body TA2, insulation layers 72 and 73 of different materials are alternately stacked by a method such as CVD. The insulation layers 72 and 73 can be formed from materials different in etching rate. For example, the insulation layers 72 can be formed from silicon oxide films, and the insulation layers 73 can be formed from silicon nitride films. The film thicknesses of the insulation layers 72 and 73 can be set to about several tens nm, for example. The numbers of the insulation layers 72 and 73 can be set to about several tens to several hundreds, for example.

Next, an insulation layer 74 is formed on the stacked body TA2 by a method such as CVD.

Next, as illustrated in FIG. 13A, an APF 75 is formed on the insulation layer 74 by a method such as CVD. The APF 75 can be formed from a material lower in etching rate than the insulation layers 72 to 74. For example, the APF 75 can be formed from a carbon film.

Next, a DARC film 76 is formed on the APF 75 by a method such as CVD. The DARC film 76 can be formed form a SiON film, for example.

Next, a resist pattern 77 is formed on the DARC film 76 by the use of a photolithography technique. The resist pattern 77 has an opening 77A.

Next, as illustrated in FIG. 13B, the DARC film 76 and the APF 75 are etched with the resist pattern 77 as a mask to transfer the opening 77A to the DARC film 76 and the APF 75. Then, the stacked body TA2 and the insulation layer 74 are etched with the APF 75 to which the opening 77A is transferred to form a memory hole MA2 in the stacked body TA2 and the insulation layer 74. The diameter of the memory hole MA2 can be set to about several tens nm, for example. After the formation of the memory hole MA2, the APF 75 is removed by a method such as ashing.

Next, as illustrated in FIG. 13C, the sacrifice film 68 is selectively etched to remove the sacrifice film 68 from the memory hole MA1. The etching agent can be phosphoric acid, for example.

Next, as illustrated in FIG. 14A, a columnar body 75 is embedded in the memory holes MA1 and MA2 by a method such as CVD. The columnar body 75 can have a memory film for storing data along the inner peripheries of the memory holes MA1 and MA2. The memory film can be provided continuously without intermission from the memory hole MA1 to the memory hole MA2.

Next, as illustrated in FIG. 14B, the insulation layers 63 and 73 are selectively etched to form air gaps 76 between the insulation layers 62 and between the insulation layers 72.

Next, as illustrated in FIG. 14C, conductive layers 77 are embedded in the air gaps 76 by a method such as CVD. At that time, a stacked body TB1 is formed on the base layer 61. In the stacked body TB1, the insulation layers 62 and the conductive layers 77 are alternately stacked. The stacked body TB1 is provided with the memory hole MA1. A stacked body TB2 is formed on the stacked body TB1. In the stacked body TB2, the insulation layers 72 and the conductive layers 77 are alternately stacked. The stacked body TB2 is provided with the memory hole MA2. The columnar body 75 is embedded in the memory holes MA1 and MA2. The material for the conductive layers 77 can be tungsten or polycrystalline silicon, for example. The top and bottom conductive layers 77 of the stacked bodies TB1 and TB2 can be used as select gate lines in an NAND flash memory. The intermediate conductive layers 77 of the stacked bodies TB1 and TB2 can be used as word lines in the NAND flash memory.

As illustrated in FIG. 14D, a central body 85 is formed at the center of the columnar body 75. A semiconductor layer 84 is formed between the inner surfaces of the memory holes MA1 and MA2 and the central body 85. A tunnel insulation film 83 is formed between the inner surfaces of the memory holes MA1 and MA2 and the semiconductor layer 84. A charge trap layer 82 is formed between the inner surfaces of the memory holes MA1 and MA2 and the tunnel insulation film 83. A block insulation film 81 is formed between the inner surfaces of the memory holes MA1 and MA2 and the charge trap layer 82.

The semiconductor layer 84 can be formed from amorphous silicon, for example. The central body 85, the tunnel insulation film 83, and the block insulation film 81 can be formed from silicon oxide films, for example. The charge trap layer 82 can be used as a memory film for storing data. The charge trap layer 82 can be formed from a silicon nitride film or an ONO film (three-layer structure of silicon oxide film/silicon nitride film/silicon oxide film). The configuration of FIG. 14D can be used as memory cells MC1 and MC2 in the NAND flash memory. The shape of the memory holes MA1 and MA2 may be oval, cocoon-like, or polygonal.

By selecting the stations A1 to A4 and B1 to B4 in which the feature amounts at the deposition of the stacked bodies TA2 satisfy the evaluation formula relative to the feature amounts at the deposition of the stacked bodies TA1 in the present lot, even when the feature amounts vary between the deposition of the stacked bodies TA1 and the deposition of the stacked bodies TA2 in the stations A1 to A4 and B1 to B4, it is possible to reduce the variations in the feature amounts between the deposition of the stacked bodies TA1 and the deposition of the stacked bodies TA2 on the respective wafers. As a result, it is possible to reduce misalignments between the stacked bodies TA1 and the stacked bodies TA2 on the respective wafers, and improve the accuracy of alignment between the stacked bodies TA1 and TA2.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A deposition supporting system comprising:
    a depositing apparatus that deposits stacked bodies on wafers allocated to stations; and
    a host computer connected to the depositing apparatus, wherein
    the host computer includes:
        an evaluation unit that evaluates feature amounts convertible to misalignments at predetermined points on the stacked bodies by the respective wafers; and
        a specification unit that specifies the stations to which the wafers are to be allocated, based on the feature amounts of the stacked bodies in the respective stations, and
    the depositing apparatus includes an allocation unit that allocates the wafers to the stations based on the specification from the host computer.

2. The deposition supporting system of claim 1, further comprising a surface shape measurement apparatus that measures surface shapes of the wafers with the stacked bodies, wherein
    the host computer calculates the feature amounts based on measurement values from the surface shape measurement apparatus.

3. The deposition supporting system of claim 1, wherein
    the stacked bodies include first stacked bodies deposited on the wafers and second stacked bodies deposited on the first stacked bodies,
    the first stacked bodies have first insulation layers and second insulation layers of different materials alternately stacked, and
    the second stacked bodies have third insulation layers and fourth insulation layers of different materials alternately stacked.

4. The deposition supporting system of claim 3, wherein, when a first station is allocated at the deposition of the first stacked body on a first wafer, a second station is allocated to the first wafer such that a second feature amount at the deposition of the second stacked body is closer to a first feature amount at the deposition of the first stacked body as compared to the case where the first station is allocated at the deposition of the second stacked body on the first wafer.

5. The deposition supporting system of claim 4, wherein the evaluation unit specifies the stations to which the wafers are to be allocated based on an evaluation formula with the first feature amounts in the respective stations at the deposition of the first stacked bodies and the second feature amounts in the respective stations at the deposition of the second stacked bodies as variables.

6. The deposition supporting system of claim 4, wherein the evaluation unit specifies the stations to which the wafers are to be allocated such that, for all the wafers to be allocated to the stations, the total sum of the first feature amount of the first stacked body and the second feature amount of the second stacked body on the respective wafers falls within a permissible value.

7. The deposition supporting system of claim 4, wherein the evaluation unit specifies the stations to which the wafers are to be allocated such that, for all the wafers to be allocated to the stations, the difference between the first feature amount of the first stacked body and the second feature amount of the second stacked body on the respective wafers falls within a permissible value.

8. The deposition supporting system of claim 4, wherein
    the host computer includes a storage unit that stores correspondence relationships between the first feature amounts at the deposition of the first stacked bodies and the second feature amounts at the deposition of the second stacked bodies in the respective stations, and
    after the deposition of the first stacked bodies on the wafers, the evaluation unit selects stations in which the second feature amounts at the deposition of the second stacked bodies satisfy the evaluation formula relative to the first feature amounts at the deposition of the first stacked bodies based on the correspondence relationships, and specifies the wafers such that the wafers are allocated to the selected stations at the deposition of the second stacked bodies.

9. The deposition supporting system of claim 4, wherein the depositing apparatus includes:
    M (M is a positive integer) chambers; and
    K (K is an integer of 2 or larger) of the stations provided in the chambers,
    the host computer includes a storage unit that stores correspondence relationships between the first feature amounts at the deposition of the first stacked bodies and the second feature amounts at the deposition of the second stacked bodies in the stations of respective chambers, and
    after the deposition of the first stacked bodies on the wafers, the evaluation unit selects stations in the chambers in which the second feature amounts at the deposition of the second stacked bodies satisfy the evaluation formula relative to the first feature amounts at the deposition of the first stacked bodies based on the correspondence relationships, and specifies the wafers such that the wafers are allocated to the selected stations of the chambers at the deposition of the second stacked bodies.

10. The deposition supporting system of claim 1, wherein the feature amounts are coefficients in an orthogonal function when height differences in the stacked bodies are expressed by a function in a XY coordinate system or a polar coordinate system.

11. A depositing apparatus comprising:
    M (M is a positive integer) chambers that house K (K is an integer of 2 or larger) wafers on which stacked bodies are to be deposited;
    K (K is an integer of 2 or larger) stations that are provided in the respective chambers and correspond to the K wafers; and
    an allocation unit that allocates the wafers to the stations in the respective chambers, wherein
    the allocation unit sets allocation of the wafers based on feature amounts convertible to misalignments at predetermined points on the stacked bodies.

12. The depositing apparatus of claim 11, wherein
    the stacked bodies include first stacked bodies deposited on the wafers and second stacked bodies deposited on the first stacked bodies,
    the first stacked bodies have first insulation layers and second insulation layers of different materials alternately stacked, and
    the second stacked bodies have third insulation layers and fourth insulation layers of different materials alternately stacked.

13. The depositing apparatus of claim 12, wherein the allocation unit sets the stations to which the wafers are to be allocated based on an evaluation formula with first feature amounts in the respective stations at the deposition of the first stacked bodies and second feature amounts in the respective stations at the deposition of the second stacked bodies as variables.

14. The depositing apparatus of claim 12, wherein, when the difference between a first feature amount at the deposition of the first stacked body in a first station and a second feature amount at the deposition of the second stacked body in the first station exceeds a permissible value and the difference between a third feature amount at the deposition of the first stacked body in a second station and a fourth feature amount at the deposition of the second stacked body in the second station is equal to or smaller than the permissible value, the allocation unit allocates the wafer on which the first stacked body is deposited in the first station to the second station at the deposition of the second stacked body.

15. The depositing apparatus of claim 12, wherein, when a first station is allocated at deposition of the first stacked body on a first wafer, a second station is allocated to the first wafer such that a second feature amount at the deposition of the second stacked body is closer to a first feature amount at the deposition of the first stacked body as compared to the case where the first station is allocated at the deposition of the second stacked body on the first wafer.

16. A manufacturing method of a semiconductor device comprising:
    allocating wafers to stations in respective chambers of a depositing apparatus at a deposit of first stacked bodies on the wafers; and
    allocating the wafers to the stations in the respective chambers of the depositing apparatus at a deposit of second stacked bodies on the first stacked bodies, wherein
    based on correspondence relationships between first feature amounts at past deposition of the first stacked bodies and second feature amounts at past deposition of the second stacked bodies, the stations of the chambers in which the second feature amounts at the past deposition of the second stacked bodies satisfy an evaluation formula relative to the first feature amounts at the past deposition of the first stacked bodies in relation to the first feature amounts at present deposition of the first stacked bodies are selected, and the wafers are allocated to the selected stations of the chambers at the deposition of the second stacked bodies.

17. The manufacturing method of a semiconductor device of claim 16, wherein
    when the first feature amounts at the past deposition of the first stacked bodies and the first feature amounts at the present deposition of the first stacked bodies in the stations of the chambers are different, the stations of the chambers providing the first feature amounts at the past deposition of the first stacked bodies closest to the first feature amounts at the present deposition of the first stacked bodies are selected, and
    the stations of the chambers in which the second feature amounts at the past deposition of the second stacked bodies satisfy the evaluation formula relative to the first feature amounts at the past deposition of the first stacked bodies in the selected stations of the chambers are selected.

18. The manufacturing method of a semiconductor device of claim 16, comprising:
    measuring surface shapes of the first stacked bodies at a past deposition;
    calculating past first feature amounts based on measurement values of the surface shapes of the first stacked bodies at the past deposition;
    measuring surface shapes of the second stacked bodies at the past deposition;
    calculating past second feature amounts based on measurement values of surface shapes of the second stacked bodies at the past deposition;
    measuring the surface shapes of the first stacked bodies at a present deposition; and
    calculating present first feature amounts based on measurement values of the surface shapes of the first stacked bodies at the present deposition.

19. The manufacturing method of a semiconductor device of claim 16, wherein, when a first station is allocated at the deposition of the first stacked body on a first wafer, a second station is allocated to the first wafer such that a second feature amount at the deposition of the second stacked body is closer to a first feature amount at the deposition of the first stacked body as compared to the case where the first station is allocated at the deposition of the second stacked body on the first wafer.

20. The manufacturing method of a semiconductor device of claim 16, comprising:
    depositing the first stacked body in which first insulation layers and second insulation layers are alternately stacked above the wafer;
    forming a first hole penetrating through the first stacked body;
    embedding a sacrifice film in the first hole;
    depositing the second stacked body in which third insulation layers and fourth insulation layers are alternately stacked above the first stacked body;
    forming a second hole penetrating through the second stacked body;
    removing the sacrifice film from the first hole;
    embedding a columnar body in the first hole and the second hole;
    removing the second insulation layers from the first stacked body and removing the fourth insulation layers from the second stacked bodies to form air gaps in the first stacked body and the second stacked body; and
    embedding conductive layers into the air gaps.

* * * * *